United States Patent
Yun et al.

(10) Patent No.: US 10,763,278 B2
(45) Date of Patent: Sep. 1, 2020

(54) SEMICONDUCTOR MEMORY DEVICE

(71) Applicant: SAMSUNG ELECTRONICS CO., LTD., Suwon-si, Gyeonggi-Do (KR)

(72) Inventors: Kyunghwa Yun, Hwaseong-si (KR); Pansuk Kwak, Seoul (KR); Chanho Kim, Seoul (KR); Junghwa Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/243,837

(22) Filed: Jan. 9, 2019

(65) Prior Publication Data

US 2019/0326319 A1   Oct. 24, 2019

(30) Foreign Application Priority Data

Apr. 24, 2018 (KR) .......................... 10-2018-0047364

(51) Int. Cl.
*H01L 27/11582* (2017.01)
*H01L 23/528* (2006.01)
*H01L 23/535* (2006.01)
*H01L 27/11573* (2017.01)

(52) U.S. Cl.
CPC ...... *H01L 27/11582* (2013.01); *H01L 23/528* (2013.01); *H01L 23/535* (2013.01); *H01L 27/11573* (2013.01)

(58) Field of Classification Search
CPC ......... H01L 27/11582; H01L 27/11573; H01L 23/535; H01L 23/528; H01L 27/11575; H01L 27/11565
See application file for complete search history.

(56) References Cited

U.S. PATENT DOCUMENTS

| | | | |
|---|---|---|---|
| 8,759,921 B2 | 6/2014 | Seo et al. | |
| 8,921,918 B2 | 12/2014 | Shim et al. | |
| 9,812,461 B2 | 11/2017 | Doda et al. | |
| 9,859,297 B2 | 1/2018 | Park et al. | |
| 2016/0172296 A1* | 6/2016 | Lim | H01L 29/40117 257/773 |
| 2016/0204111 A1* | 7/2016 | Park | H01L 23/3171 257/324 |
| 2017/0104000 A1 | 4/2017 | Park et al. | |
| 2017/0294388 A1 | 10/2017 | Yoon et al. | |
| 2017/0373087 A1 | 12/2017 | Ito et al. | |

* cited by examiner

*Primary Examiner* — Yasser A Abdelaziez
(74) *Attorney, Agent, or Firm* — Volentine, Whitt & Francos, PLLC

(57) ABSTRACT

A semiconductor memory device includes a substrate having a cell array region and a contact region, a stack structure including a plurality of gate electrodes on the cell array region and the contact region, a plurality of cell vertical channel structures extending through the stack structure on the cell array region, and a contact structure disposed beside of the stack structure on a top surface of the substrate and disposed along a line extending from the cell array region toward the contact region. The height of the contact structure on the cell array region is different from the height of the contact structure on the contact region.

20 Claims, 29 Drawing Sheets

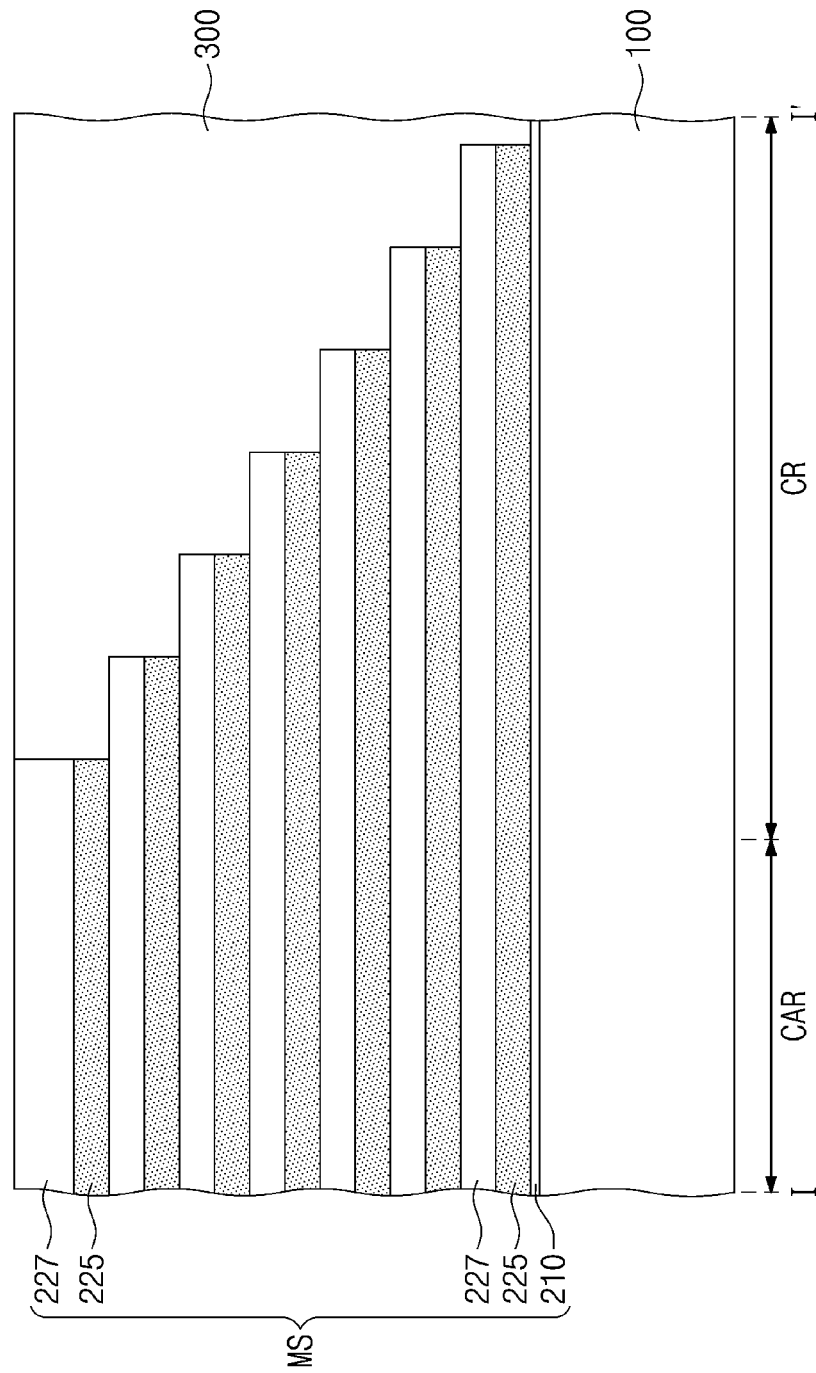

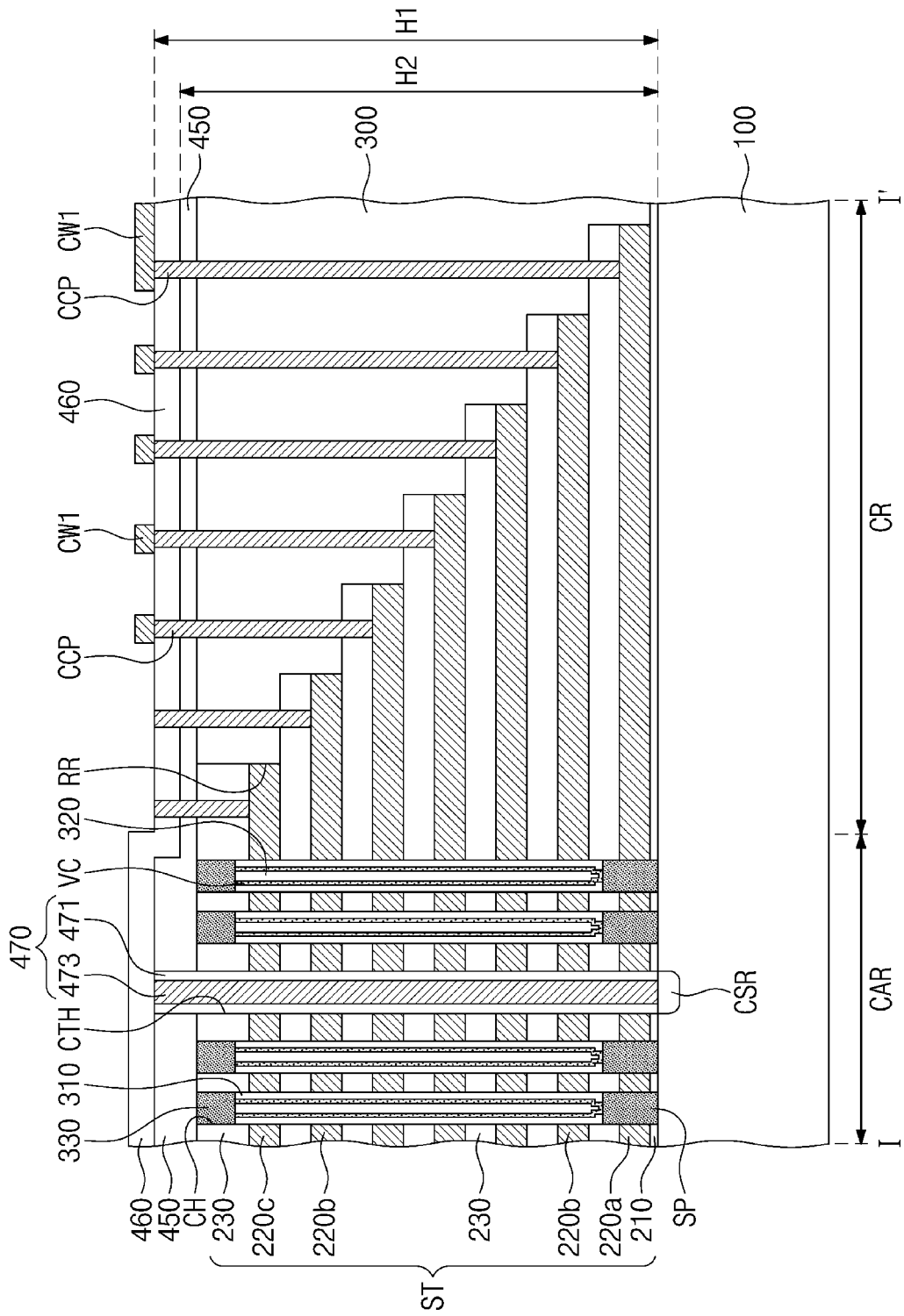

SEMICONDUCTOR MEMORY DEVICE

PRIORITY STATEMENT

This U.S. nonprovisional application claims priority under 35 U.S.C § 119 to Korean Patent Application No. 10-2018-0047364 filed on Apr. 24, 2018 in the Korean Intellectual Property Office, the entire contents of which are hereby incorporated by reference.

BACKGROUND

The inventive concepts relate to a semiconductor memory device, and more particularly, to a three-dimensional semiconductor memory device.

Semiconductor devices that offer high performance and which are low in cost to manufacture are in demand. In this respect, the integration density of semiconductor devices is an important factor in determining product price. Therefore, highly integrated semiconductor devices are increasingly sought after in particular. The integration density of typical two-dimensional or planar semiconductor memory devices is primarily determined by the area occupied by a unit memory cell constitute by fine patterns. Accordingly, the degree to which typical two-dimensional or planar semiconductor memory devices can be integrated is greatly influenced by the level of technology for forming fine patterns. However, extremely expensive processing equipment is required to form pattern fineness and thus equipment costs set a practical limitation on increasing the integration density of the two-dimensional or planar semiconductor memory devices. Therefore, three-dimensional semiconductor memory devices having three-dimensionally arranged memory cells have been proposed.

SUMMARY

According to some examples of the inventive concepts, a semiconductor memory device comprises a substrate having a cell array region and a contact region, a stack structure on the cell array region and the contact region of the substrate and comprising a plurality of gate electrodes, a plurality of cell vertical channel structures on the cell array region of the substrate and extending through the stack structure, and a contact structure disposed beside the stack structure on a top surface of the substrate and disposed on both the cell array region and the contact region of the substrate along a line extending from the cell array region onto the contact region. The contact structure has a first height on the cell array region and a second height on the contact region, and the first height is different than the second height.

Also, according to some examples of inventive concepts, a semiconductor memory may comprises a substrate having a cell array region and a contact region, a stack structure on the cell array region and the contact region of the substrate and comprising a plurality of gate electrodes, a contact structure disposed beside the stack structure on a top surface of the substrate and disposed on both the cell array region and the contact region of the substrate along a line extending from the cell array region onto the contact region, and a plurality of cell contact plugs on ends of the gate electrodes located on the contact region of the substrate. A top surface of one of the cell contact plugs is located at a level the same as or lower than that of a top surface of the contact structure on the cell array region.

Also, according to some examples of inventive concepts, a semiconductor memory device comprises a substrate having a cell array region and a contact region, a stack structure on the cell array region and the contact region of the substrate and comprising a plurality of gate electrodes, a plurality of cell vertical channel structures extending through the stack structure on the cell array region of the substrate, a contact structure disposed beside the stack structure on a top surface of the substrate and disposed on both the cell array region and the contact region of the substrate along a line extending from the cell array region onto the contact region, and an interlayer dielectric structure covering a top surface of the contact structure. The interlayer dielectric structure has a first thickness on the cell array region and a second thickness on the contact region, and the first thickness of the interlayer dielectric structure is different from the second thickness of the interlayer dielectric structure.

Also, according to some examples of inventive concepts, a semiconductor memory device comprises a substrate having a cell array region, a contact region and a peripheral region, peripheral transistor located at an upper portion of the peripheral region of the substrate, a stack structure on the cell array region and the contact region of the substrate and comprising a plurality of gate electrodes having a staircase-shaped portion on the contact region, a plurality of cell vertical channel structures extending through the stack structure on the cell array region of the substrate, a contact structure disposed beside the stack structure on a top surface of the substrate and disposed on the cell array region and the contact region of the substrate along a line extending from the cell array region onto the contact region, that contact structure having a top surface including a first portion on the contact region of the substrate and a second portion on the cell array region, the first portion of the top surface of the contact structure being situated at a level lower than that of the second portion of the top surface of the contact structure, an interlayer dielectric layer extending over the contact structure, over the stack structure on the cell array region and the contact region of the substrate, and over the peripheral transistor on the peripheral region of the substrate, the interlayer dielectric layer having a step such that a first portion of the top surface of the interlayer dielectric layer on the peripheral region of the substrate is situated at a level lower than that of a second portion of the top surface of the interlayer dielectric layer on the cell array region of the substrate, a first cell contact plug on an end of a first one of the gate electrodes that is disposed on the contact region of the substrate, the first cell contact plug having a top surface at the same level as the first portion of the top surface of the interlayer dielectric layer, a second cell contact plug on an end of a second one of the gate electrodes that is disposed on the contact region of the substrate, the second cell contact plug being disposed closer to the cell array region than the first cell contact plug, a first connection line extending along the first portion of the top surface of the interlayer dielectric layer from the top surface of the first cell contact plug and over the peripheral region of the substrate, the first connection line being electrically connected to the peripheral transistor, and a second electrical connection line situated at a level above that of the first connection line. The second electrical connection line is electrically connected to the second cell contact plug at a location situated at the same level as or at a level above the second portion of the top surface of the interlayer dielectric layer.

BRIEF DESCRIPTION OF THE DRAWINGS

FIGS. 17A-23B are cross-sectional views of the example of a semiconductor device shown in FIGS. 2-6 during the course of its manufacture, showing a method of fabricating a semiconductor memory device according to the inventive concepts, wherein FIGS. 17A, 18A, 19A, 20A, 21A, 22A and 23A are cross-sectional views taken in the direction of line I-I' of FIG. 2 and FIGS. 17B, 18B, 19B, 20B, 21B, 22B, and 23B are cross-sectional views taken in the direction of line II-IF of FIG. 2.

DETAILED DESCRIPTION

Figure 1:
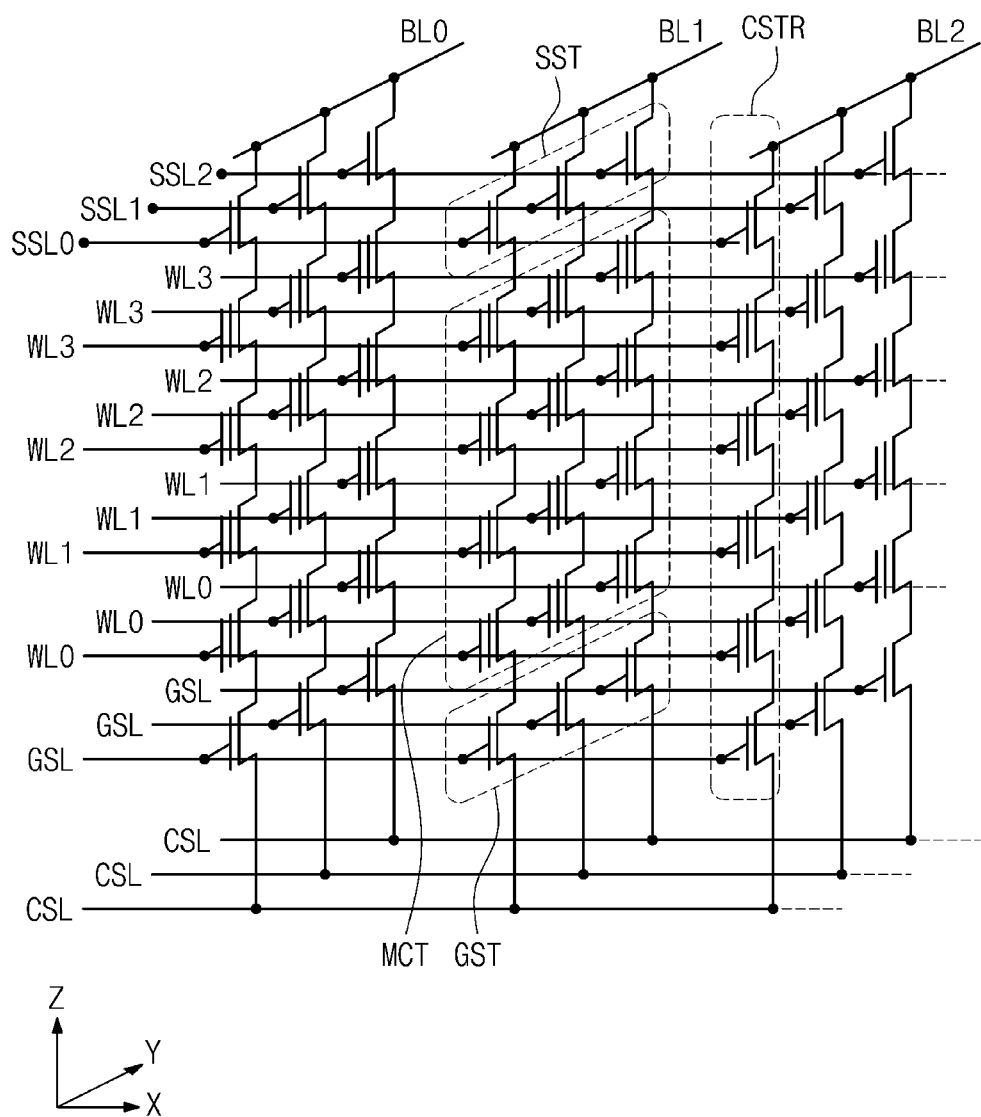
FIG. 1 is an equivalent circuit diagram of a cell array of a semiconductor memory device according to the inventive concepts.

Referring to FIG. 1, semiconductor memory devices according to the inventive concept may include a common source line CSL, a plurality of bit lines BL0 to BL2, and a plurality of cell strings CSTR between the common source line CSL and the bit lines BL0 to BL2.

The bit lines BL0 to BL2 may be arrayed two-dimensionally, and a plurality of cell strings CSTR may be connected in parallel to each of the bit lines BL0 to BL2. Thus, the cell strings CSTR may be two-dimensionally arranged either on the common source line CSL or on a substrate.

Each of the cell strings CSTR may include a ground select transistor GST connected to the common source line CSL, a string select transistor SST connected to one of the bit lines BL0 to BL2, and a plurality of memory cell transistors MCT between the ground and string select transistors GST and SST. The ground select transistor GST, the string select transistor SST, and the memory cell transistors MCT may be connected in series. In addition, a ground select line GSL, a plurality of word lines WL0 to WL3, and a plurality of string select lines SSL0 to SSL2, are disposed between the common source line CSL and the bit lines BL0 to BL2. The ground select line GSL, word lines WL0 to WL3, and string select lines SSL0 to SSL2 may be respectively used as gate electrodes of the ground select transistor GST, the memory cell transistors MCT, and the string select transistor SST.

Because one cell string CSTR includes a plurality of memory cell transistors MCT at different distances from the common source line CSL, the word lines WL0 to WL3 may have a multi-layered structure between the common source line CSL and the bit lines BL0 to BL2. The ground and string select transistors GST and SST and the memory cell transistors MCT may be MOS field effect transistors (MOSFET) that use channel structures as channel regions.

An example of a semiconductor memory device according to the inventive concepts will now be described in detail with reference to FIGS. 2, 3, 4, 5, and 6.

A substrate 100 may be provided thereon with a peripheral circuit transistor TR and stack structures ST. The substrate 100 may have a cell array region CAR, a contact region CR, and a peripheral circuit region PR. The contact region CR may be disposed between the cell array region CAR and the peripheral circuit region PR. The peripheral circuit region PR may be an X-decoder region. The substrate 100 may be or include a silicon substrate, a silicon-germanium substrate, a germanium substrate, or a single crystalline epitaxial layer grown on a single crystalline silicon substrate.

The peripheral circuit transistor TR may be provided on the peripheral circuit region PR of the substrate 100. For example, the peripheral circuit transistor TR may be provided on an active region defined by a device isolation layer disposed in the substrate 100. The peripheral circuit transistor TR may include a peripheral gate dielectric layer 10, a peripheral gate electrode 20, and source/drain regions 30. The peripheral gate dielectric layer 10 may be disposed on the active region of the substrate 100. The peripheral gate dielectric layer 10 may include a silicon oxide layer or a thermal oxide layer. The peripheral gate electrode 20 may be disposed on the peripheral gate dielectric layer 10. The peripheral gate electrode 20 may include a metal or impurity-doped polysilicon pattern. The source/drain regions 30 may be disposed in the active region of the substrate 100 on opposite sides of the peripheral gate electrode 20. Each of the source/drain regions 30 may have a different conductivity from that of the substrate 100.

The stack structures ST may be disposed on the cell array region CAR and the contact region CR of the substrate 100. The stack structures ST may extend longitudinally in a first direction X on a top surface of the substrate 100 and may be spaced apart from each other in a second direction Y intersecting the first direction X. A common source region CSR may be disposed in the substrate 100 between the stack structures ST. The common source region CSR may extend in the first direction X. The common source region CSR may have a different conductivity from that of the substrate 100.

Each of the stack structures ST may include a buffer oxide layer 210, gate electrodes 220a, 220b, and 220c, and insulating patterns 230, which gate electrodes and insulating patterns are alternately and repeatedly stacked on the buffer oxide layer 210. On the peripheral circuit region PR, the buffer oxide layer 210 may cover the top surface of the substrate 100 and a surface of the peripheral circuit transistor TR. The buffer oxide layer 210 may include a thermal oxide layer or a silicon oxide layer. The gate electrodes 220a, 220b, and 220c may include a ground select gate electrode 220a, cell gate electrodes 220b, and a string select gate electrode 220c. The ground select gate electrode 220a may correspond to a lowermost one of the gate electrodes 220a, 220b, and 220c, and the string select gate electrode 220c may be an uppermost one of the gate electrodes 220a, 220b, and 220c. The cell gate electrodes 220b may be disposed between the ground select gate electrode 220a and the string select gate electrode 220c.

The stack structures ST may have stepped or "staircase-shaped" portions on the contact region CR of the substrate 100. For example, each of the stack structures ST may have a height that decreases with increasing distance from the cell array region CAR. For example, the gate electrodes 220a, 220b, and 220c may have respective lengths in the first direction X, which lengths may decrease with increasing distance from the substrate 100. In an example, each of the gate electrodes 220a, 220b, and 220c has an end on the contract region CR of the substrate 100. The end of each of the ground select and cell gate electrodes 220a and 220b may correspond to an exposed portion that is not covered with a next overlying gate electrode. The end of the string select gate electrode 220c may be its portion disposed on the contact region CR. Note, here and in the description that follow, the term "height" as context makes clear may refer to the dimension of a particular element or feature relative to a reference plane such as a plane of the upper surface of the substrate, as opposed to the dimension of the element or feature from top to bottom.

The insulating patterns 230 may be disposed between the gate electrodes 220a, 220b, and 220c adjacent to each other in a third direction Z perpendicular to the top surface of the substrate 100, and also disposed on the string select gate electrode 220c. The insulating patterns 230 may each comprise a silicon oxide layer. The insulating patterns 230 may have respective lengths in the first direction X, which lengths may decrease with increasing distance from the substrate 100. The length in the first direction X of each of the insulating patterns 230 may be substantially the same as the length in the first direction X of a neighboring underlying gate electrode. The insulating patterns 230 may cover the ends of the gate electrodes 220a, 220b, and 220c.

An interlayer dielectric pattern 300 may cover the stepped portions of the stack structures ST and the peripheral circuit transistor TR. The interlayer dielectric pattern 300 may have a top surface at the same level as that of top surfaces of the stack structures ST. The interlayer dielectric pattern 300 may comprise a tetraethylorthosilicate (TEOS) oxide layer.

Cell vertical channel structures VS may extend through the stack structures ST. For example, the cell vertical channel structures VS may extend vertically on the top surface of the cell array region CAR of the substrate 100 through the stack structures ST. The cell vertical channel structures VS may be arranged in a zigzag fashion or in a straight line.

Dummy vertical channel structures DVS may extend through the stack structures ST. For example, the dummy vertical channel structures DVS may extend on the top surface of the contact region CR of the substrate 100 vertically through the stack structures ST. On the ends of the gate electrodes 200a, 200b, and 200c, the dummy vertical channel structures DVS may extend through the stepped portions of the stack structures ST. When viewed in plan, the dummy vertical channel structures DVS may be arranged in a zigzag fashion or in a straight line. In an example, the cell vertical channel structures VS and the dummy vertical channel structures DVS have top surfaces at the same level as that of the top surface of the interlayer dielectric pattern 300.

Each of the cell vertical channel structures VS and each of the dummy vertical channel structures DVS may include a vertical channel VC, a charge storage structure 310, a gap-fill layer 320, and a pad 330. The vertical channel VC may extend on the top surface of the substrate 100 vertically through the stack structure ST. The vertical channel VC may have a hollow pipe shape, a cylindrical shape, or a cup shape. The vertical channel VC may include a single layer or a plurality of layers. The vertical channel VC may include at least one of a single crystalline silicon layer, an organic semiconductor layer, and a carbon nanostructure.

The charge storage structure 310 may be disposed between the vertical channel VC and the gate electrodes 220a, 220b, and 220c. The charge storage structure 310 may extend along an outer wall surface of the vertical channel VC. For example, the charge storage structure 310 may extend around the vertical channel VC. The charge storage structure 310 may include a single layer or a plurality of layers. For example, the charge storage structure is of at least one layer selected from the group consisting of a silicon oxide layer, a silicon nitride layer, a silicon oxynitride layer, and a high-k dielectric layer.

Figure 6:
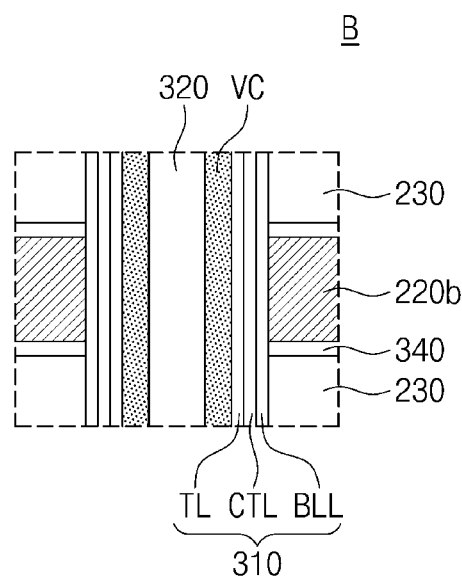
FIG. 6 is an enlarged view showing section B of FIG. 3.

As shown in FIG. 6, the charge storage structure 310 may include a tunnel insulating layer TL, a blocking insulating layer BLL, and a charge storage layer CTL. The tunnel insulating layer TL may be adjacent to the vertical channel VC and may surround the vertical channel VC. The blocking insulating layer BLL may be adjacent to the gate electrodes 220a, 220b, and 220c. The charge storage layer CTL may be disposed between the tunnel insulating layer TL and the blocking insulating layer BLL. The tunnel insulating layer TL may comprise a silicon oxide layer or a high-k dielectric layer (e.g., aluminum oxide ($Al_2O_3$) or hafnium oxide ($HfO_2$)). The blocking insulating layer BLL may comprise a silicon oxide layer or a high-k dielectric layer (e.g., aluminum oxide ($Al_2O_3$) or hafnium oxide ($HfO_2$)). The charge storage layer CTL may comprise a silicon nitride layer.

The gap-fill layer 320 may be disposed inwardly of the vertical channel VC. The gap-fill layer 320 may comprise a silicon oxide layer, a silicon nitride layer, or a silicon oxynitride layer. The pad 330 may be disposed on an upper portion of each of the vertical channel VC, the charge storage structure 310, and the gap-fill layer 320. The pad 330 may comprise a conductive material or a semiconductor material doped with impurities having a different conductivity from that of the vertical channel VC.

Semiconductor pillars SP may be disposed between the cell vertical channel structures VS and the substrate 100. Dummy semiconductor pillars DSP may be disposed between the dummy vertical channel structures DVS and the substrate 100. The semiconductor pillars SP and the dummy semiconductor pillars DSP may be disposed on the top surface of the substrate 100 and may extend through the ground select gate electrode 220a. Each of the semiconductor pillars SP and of the dummy semiconductor pillars DSP may contact the vertical channel VC. Each of the semiconductor pillars SP and of the dummy semiconductor pillars DVS may be an intrinsic semiconductor or a semiconductor whose conductivity is the same as that of the substrate 100.

As shown in FIG. 6, a horizontal insulating layer 340 may be disposed between the charge storage structure 310 and each of the gate electrodes 220a, 220b, and 220c, and may extend along top and bottom surfaces of each of the gate electrodes 220a, 220b, and 220c. The horizontal insulating layer 340 may comprise a silicon oxide layer (e.g., $SiO_2$) or a high-k dielectric layer (e.g., aluminum oxide ($Al_2O_3$) or hafnium oxide ($HfO_2$)).

A first interlayer dielectric layer 450 may be disposed on the stack structures ST and the interlayer dielectric pattern 300. The first interlayer dielectric layer 450 may cover the top surface of the interlayer dielectric pattern 300 and the top surfaces of the stack structures ST. The first interlayer dielectric layer 450 may comprise a silicon oxide layer.

In an example, the first interlayer dielectric layer 450 on the cell array region CAR may has top surface whose level is different from that of a top surface of the first interlayer dielectric layer 450 on the contact and peripheral circuit regions CR and PR. For example, the top surface of the first interlayer dielectric layer 450 on the cell array region CAR may be higher than the top surface of the first interlayer dielectric layer 450 on the contact and peripheral circuit regions CR and PR. The top surface of the first interlayer dielectric layer 450 on the contact and peripheral circuit regions CR and PR may be disposed at a level higher than that of the top surfaces of the cell and dummy vertical channel structures VS and DVS.

A contact structure 470 may be disposed between the stack structures ST adjacent to each other in the second direction Y. The contact structure 470 may extend horizontally in the first direction X and may be disposed on the cell array region CAR and the contact region CR of the substrate 100. When viewed in plan, the contact structure 470 may have a rectangular or linear shape extending longitudinally in the first direction X. Alternatively, the contact structure 470 may have a plurality of discrete sections, and the plurality of sections of the contact structure 470 may be arranged in the first direction X along the common source region CSR. In this case, the plurality of sections of the contact structure 470 may each have the form of a pillar.

The contact structure 470 may include a spacer 471 and a common source contact 473. The common source contact 473 may be electrically connected to the common source region CSR. The common source contact 473 may comprise a metal (e.g., tungsten, copper, or aluminum) or transition metal (e.g., titanium or tantalum). The spacer 471 may extend around the common source contact 473. The spacer 471 may comprise an insulating material (e.g., a silicon oxide layer or a silicon nitride layer).

In an example, the contact structure 470 has a first height H1 on the cell array region CAR and a second height H2 on the contact region CR, which first and second heights H1 and H2 are different from each other. For example, the first height H1 may be greater than the second height H2 (H1>H2). Thus, (an upper portion of) the contact structure 470 has a step above the boundary between the cell array region CAR and the contact region CR. A semiconductor memory device according to the inventive concepts may include a plurality of the contact structures 470, each of which contact structures 470 may have a step.

The second height H2 may be greater than those of the cell and dummy vertical channel structures VS and DVS. Each of the first and second heights H1 and H2 may be a distance from the top surface of the substrate 100 to a top surface of the contact structure 470. Each of the heights of the cell and dummy vertical channel structures VS and DVS may be a distance from the top surface of the substrate 100 to a top surface of the pad 330.

In an example, the top surface of the contact structure 470 on the contact region CR may be disposed at a level lower than that of the top surface of the contact structure 470 on the cell array region CAR. The top surface of the contact structure 470 on the contact region CR may be disposed at a level higher than that of each of the top surfaces of the cell and dummy vertical channel structures VS and DVS.

The contact structure 470 may extend through the first interlayer dielectric layer 450. The top surfaces of the contact structure 470 and the first interlayer dielectric layer 450 may be located at the same level. For example, the top surface of the contact structure 470 on the cell array region CAR may be located at the same level as that of the top surface of the first interlayer dielectric layer 450 on the cell array region CAR. For example, the top surface of the contact structure 470 on the contact region CR may be located at the same level as that of the top surface of the first interlayer dielectric layer 450 on the contact and peripheral circuit regions CR and PR.

A second interlayer dielectric layer 460 may be disposed on the first interlayer dielectric layer 450. The second interlayer dielectric layer 460 may cover the top surface of the first interlayer dielectric layer 450. Accordingly, a top surface of the second interlayer dielectric layer 460 on the cell array region CAR may be disposed at a level higher than that of a top surface of the second interlayer dielectric layer 460 on the contact and peripheral circuit regions CR and PR. The second interlayer dielectric layer 460 may comprise a silicon oxide layer.

Cell contact plugs CCP may be disposed on the contact region CR of the substrate 100. The cell contact plugs CCP may extend through the first and second interlayer dielectric layers 450 and 460 and the interlayer dielectric pattern 300, and may be disposed on the ends of the gate electrodes 220a, 220b, and 220c. The cell contact plugs CCP may contact top surfaces of the ends of the gate electrodes 220a, 220b, and 220c. In an example, the cell contact plugs CCP have top surfaces disposed at a level lower than that of the top surface of the contact structure 470 on the cell array region CAR and higher than that of the top surface of the contact structure 470 on the contact region CR. The top surfaces of the cell contact plugs CCP may be located at the same level. The cell contact plugs CCP may comprise at least one of a metal (e.g., copper or tungsten) and a metal nitride (e.g., TiN, TaN, or WN).

Peripheral contact plugs PCP may be disposed on the peripheral circuit region PR of the substrate 100. The peripheral contact plugs PCP may extend through the first and second interlayer dielectric layers 450 and 460 and the interlayer dielectric pattern 300, and may be disposed on the peripheral gate electrode 20 and the source/drain regions 30. The peripheral contact plugs PCP may have top surfaces at the same level as that of the top surfaces of the cell contact plugs CCP. The peripheral contact plugs PCP may comprise at least one of a metal (e.g., copper or tungsten) and a metal nitride (e.g., TiN, TaN, or WN).

Figure 5:
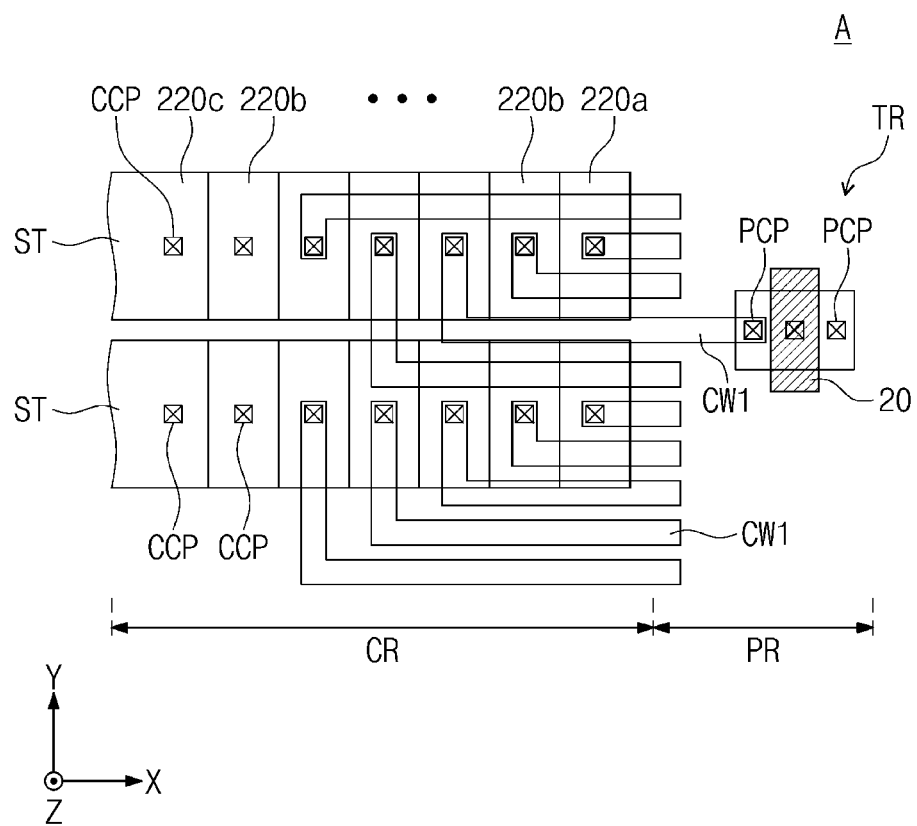
FIG. 5 is a detailed view showing section A of FIG. 2.

First connection lines CW1 may be disposed on the top surface of the second interlayer dielectric layer 460. The first connection lines CW1 may be disposed on the top surfaces of respective ones of the cell contact plugs CCP. In an example, as shown in FIG. 5, the first connection lines CW1 may be disposed on the cell contact plugs CCP provided on the ground select gate electrode 220a and on ones of the cell contact plugs CCP provided on the cell gate electrodes 220b. In an example, none of the first connection lines CW1 may be disposed on the cell contact plug CCP connected to the string select gate electrode 220c or on the cell contact plug CCP connected to an uppermost one of the cell gate electrodes 220b. The first connection lines CW1 may extend from the contact region CR onto the peripheral circuit region PR. Each of the first connection lines CW1 may extend from one cell contact plug CCP onto one peripheral contact plug PCP disposed on the peripheral circuit region PR. Accordingly, each of the first connection lines CW1 may electrically connect one of the gate electrodes 220a, 220b, and 220c to the peripheral circuit transistor TR.

A third interlayer dielectric layer 480 may be disposed on the second interlayer dielectric layer 460. The third interlayer dielectric layer 480 may be disposed locally on the second interlayer dielectric layer 460 on the contact and peripheral circuit regions CR and PR. The third interlayer dielectric layer 480 may cover the first connection lines CW1. The third interlayer dielectric layer 480 may expose the top surface of the second interlayer dielectric layer 460 on the cell array region CAR. The third interlayer dielectric layer 480 may comprise a silicon oxide layer.

Studs STD may extend through the third interlayer dielectric layer 480. The studs STD may be disposed on the cell contact plugs CCP on which the first connection lines CW1 are not disposed. For example, the studs STD may be disposed on the cell contact plug CCP connected to the string select gate electrode 220c and on the cell contact plug CCP connected to the uppermost cell gate electrode 220b. The studs STD may comprise at least one of a conductive metal nitride and a doped semiconductor.

Second connection lines CW2 may be disposed on the studs STD. Although not shown, the second connection lines CW2 may extend from the studs STD onto the peripheral contact plugs PCP on the peripheral circuit region PR. Accordingly, each of the second connection lines CW2 may electrically connect one of the gate electrodes 220a, 220b, and 220c to the peripheral circuit transistor TR.

A fourth interlayer dielectric layer 490 may be disposed on the second and third interlayer dielectric layers 460 and 480. The fourth interlayer dielectric layer 490 may cover the top surface of the second interlayer dielectric layer 460 and a top surface of the third interlayer dielectric layer 480, which top surface of the second interlayer dielectric layer 460 is not covered with the third interlayer dielectric layer 480. The fourth interlayer dielectric layer 490 may cover the second connection lines CW2. The fourth interlayer dielectric layer 490 may comprise a silicon oxide layer.

In an example, an interlayer dielectric structure IS includes interlayer dielectric layers disposed on the top surfaces of the contact structure 470 and the first interlayer dielectric layer 450. The interlayer dielectric structure IS may have a first thickness T1 on the cell array region CAR and a second thickness T2 on the contact and peripheral circuit regions CR and PR, which first thickness T1 may be less than the second thickness T2 (T1<T2). The number of interlayer dielectric layers stacked on the cell array region CAR may be less than the number of interlayer dielectric layers stacked on the contact and peripheral circuit regions CR and PR. For example, the second and fourth interlayer dielectric layers 460 and 490 may be stacked on the cell array region CAR, and the second, third, and fourth interlayer dielectric layers 460, 480, and 490 may be stacked on the contact and peripheral circuit regions CR and PR.

Channel contact plugs HCP may be disposed on the cell vertical channel structures VS. The channel contact plugs HCP may contact the pads 330. The channel contact plugs HCP may comprise at least one of a metal (e.g., copper or tungsten) and a metal nitride (e.g., TiN, TaN, or WN).

Bit lines BL may be disposed on the fourth interlayer dielectric layer 490. The bit lines BL may extend longitudinally in the second direction Y and run across the stack structures ST. The bit lines BL may be spaced apart from each other in the first direction X on the fourth interlayer dielectric layer 490. Each of the bit lines BL may be electrically connected to the vertical channels VC of the cell vertical channel structures VS arranged in the second direction Y. The bit lines BL may comprise a metal (e.g., tungsten).

According to examples of the inventive concepts, the second height H2 of the contact structure 470 on the contact region CR is less than the first height H1 of the contact structure 470 on the cell array region CAR and the first connection lines CW1 are located at a lower level than the bit lines BL. Because the heights of the channel contact plugs HCP affect capacitances of the bit lines BL, when the first connection lines CW1 are located at a relatively low level, the heights of the channel contact plugs HCP may be kept to a minimum to decrease capacitances of the bit lines BL. Note here, the term "level" when used to describe an element, such as a conductive line, as a whole will generally refer to the level of the surface or plane on which the element is formed.

Another example of a semiconductor memory device according to the inventive concepts is shown in and will be described with reference to FIGS. 7 and 8. For brevity, like components of the examples of the semiconductor memory devices according to the inventive concepts are allocated the same reference numerals and a detailed description of such components will not be repeated.

Figure 7:
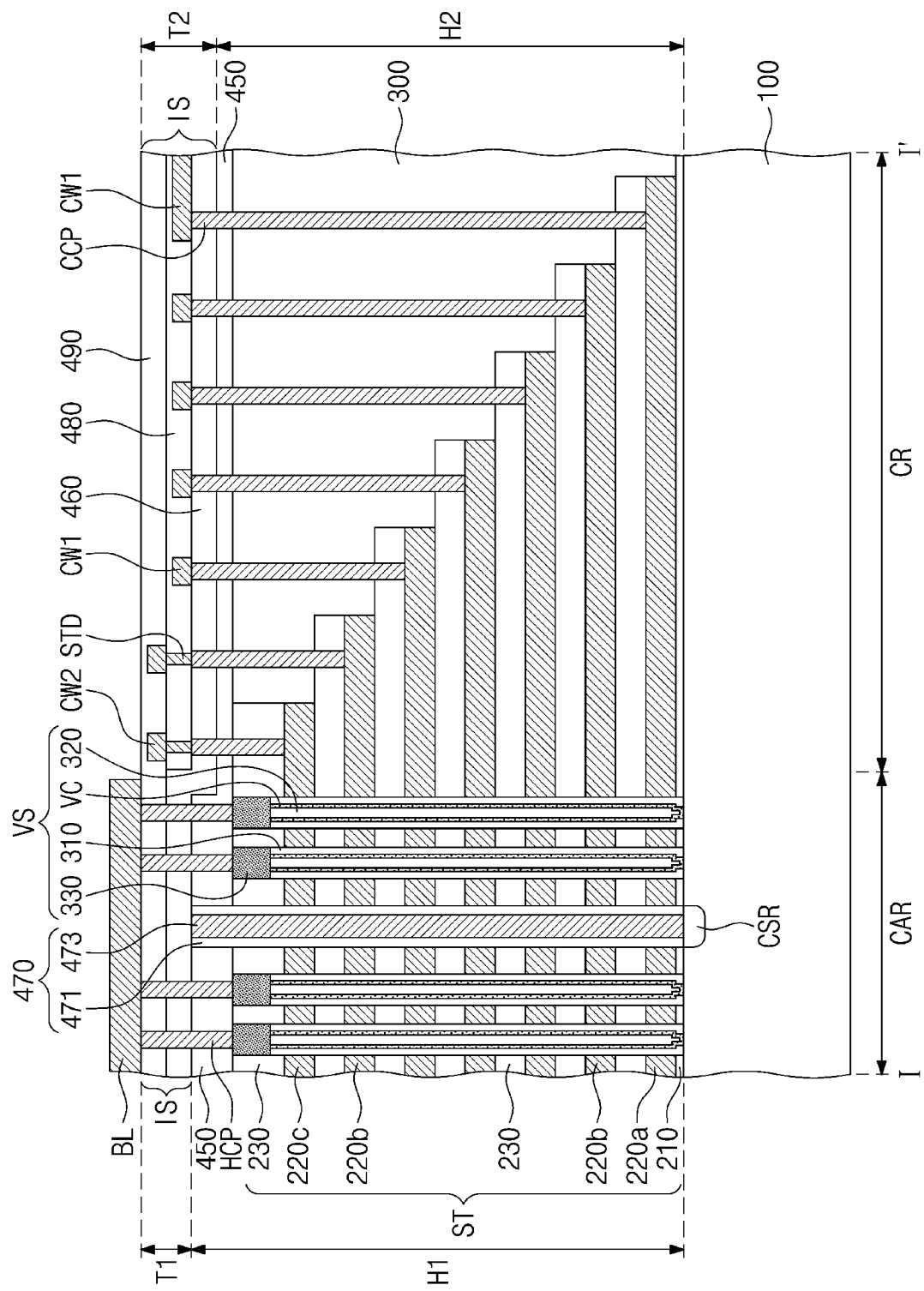
FIG. 7 is a cross-sectional view of another version of the example of a semiconductor device according to the inventive concept shown in FIG. 2, as taken in the direction of line I-I' of FIG. 2.
Figure 8:
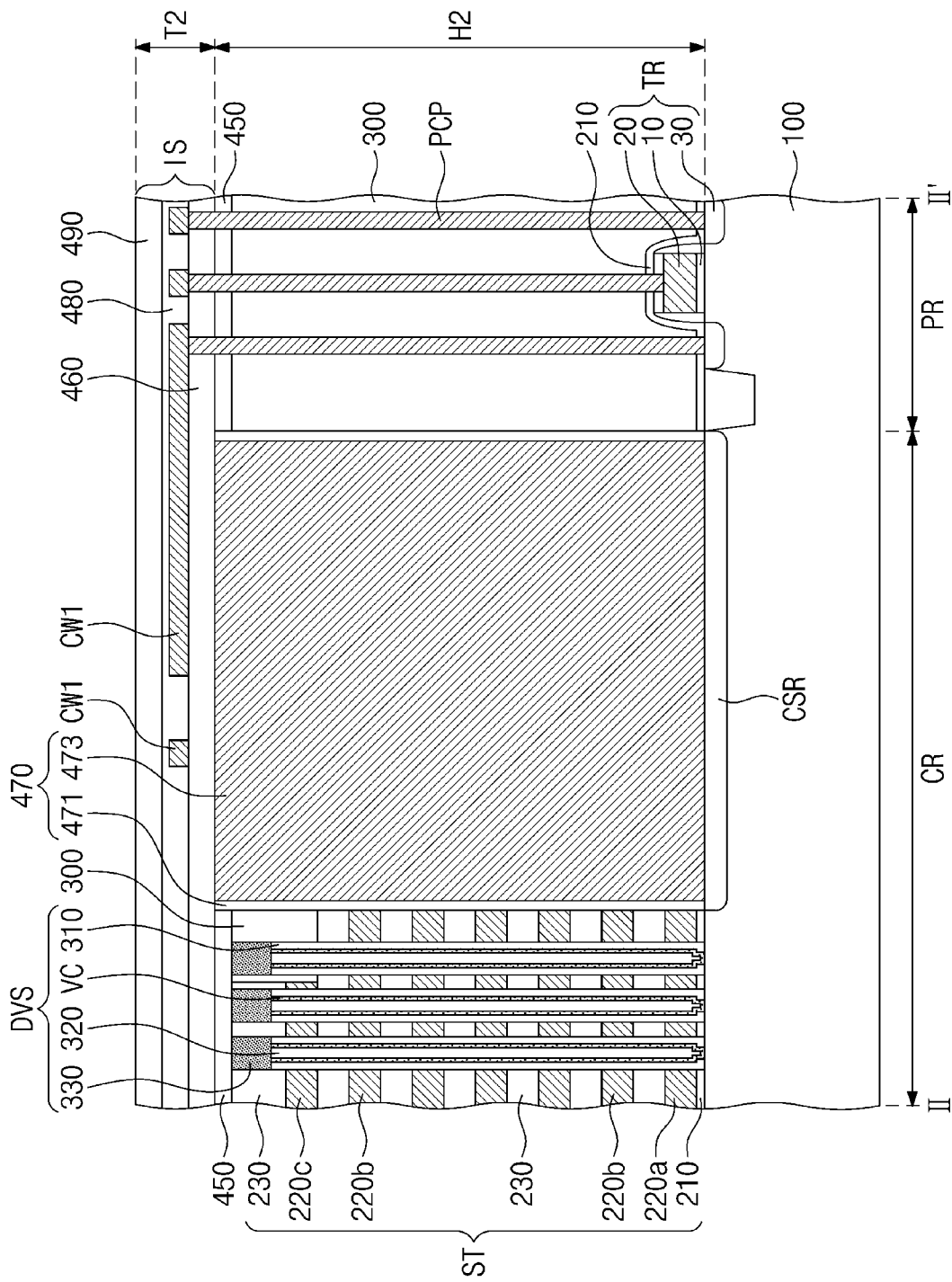
FIG. 8 is a cross-sectional view of the another version of the example taken in the direction of line II-IF of FIG. 2.

Referring to FIGS. 7 and 8, the vertical channel VC, the charge storage structure 310, and the gap-fill layer 320 may contact the top surface of the substrate 100. That is, the present example does not include either the semiconductor pillar SP or the dummy semiconductor pillar DSP of the example described above with reference to FIGS. 3 and 4.

Figure 9:
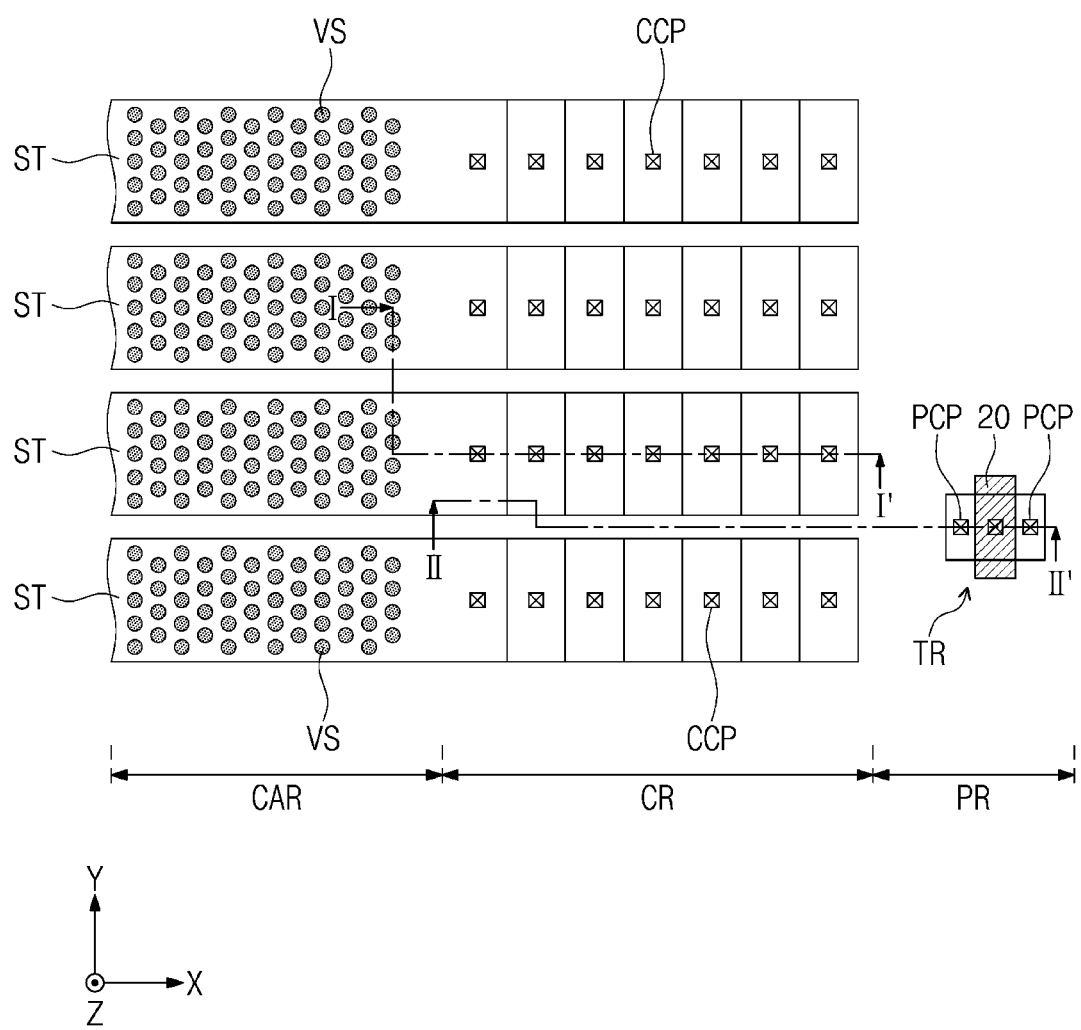
FIG. 9 is a plan view of another example of a semiconductor memory device according to the inventive concepts.
Figure 10:
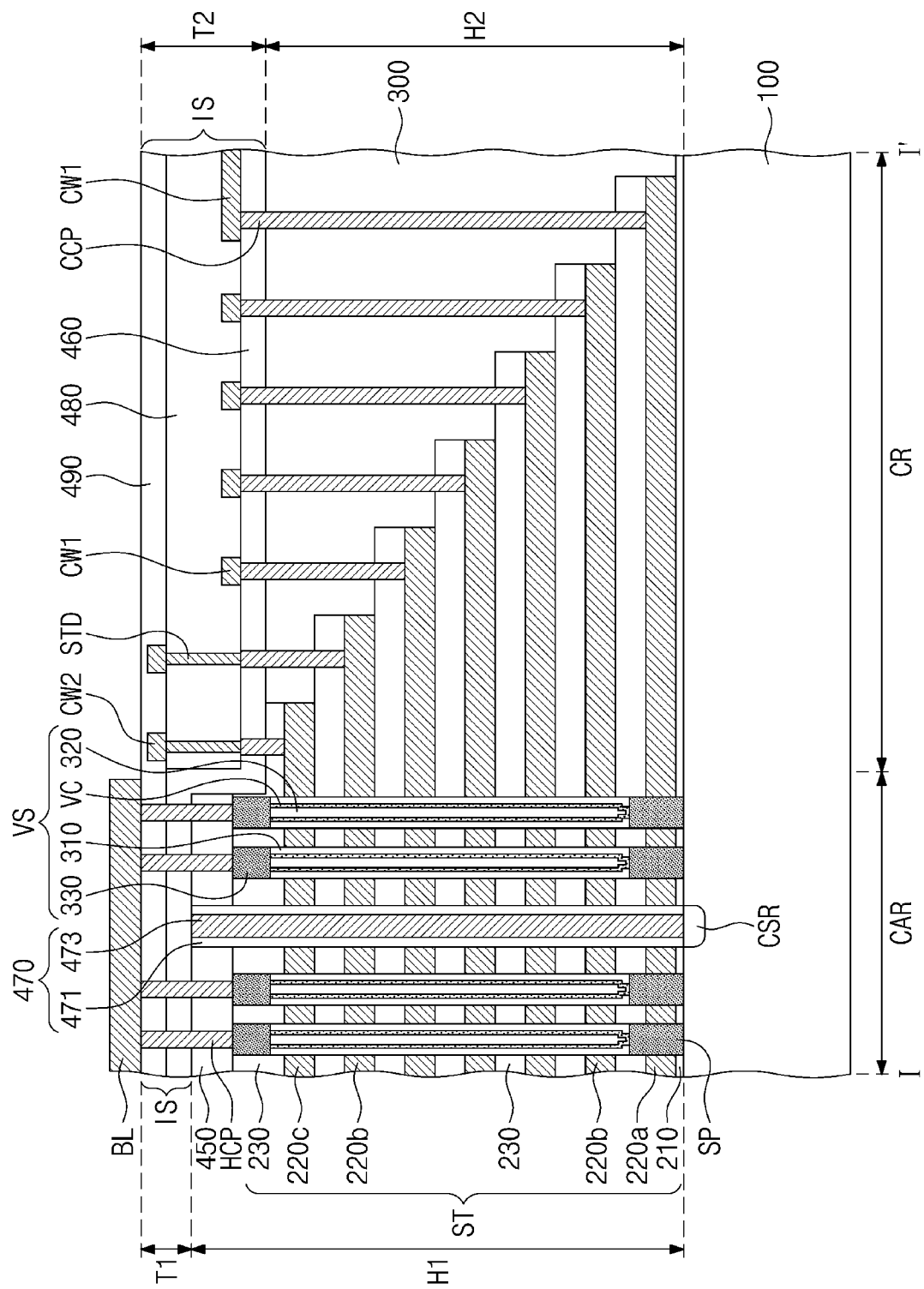
FIG. 10 is a cross-sectional view taken along line I-I' of FIG. 9.
Figure 11:
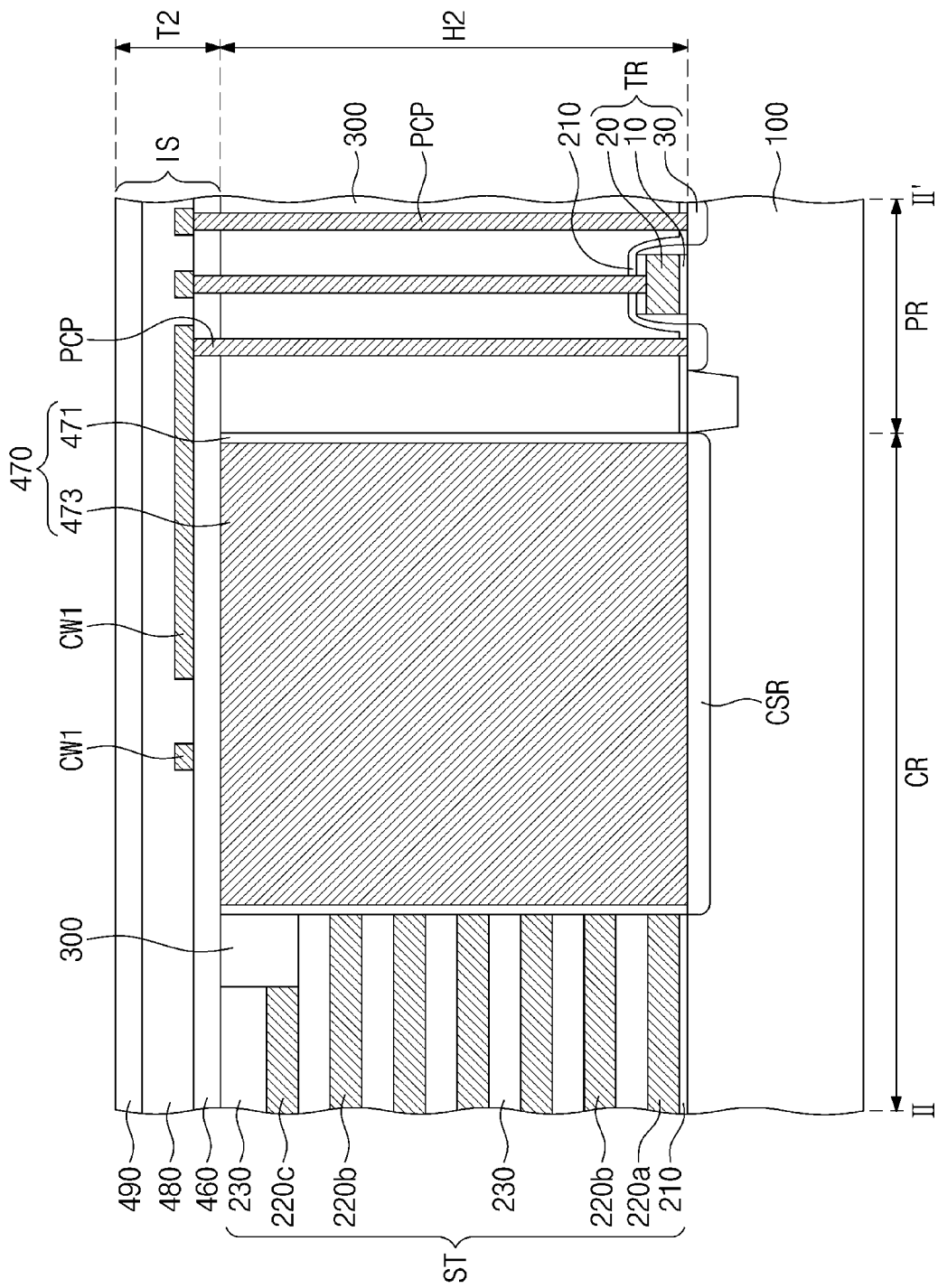
FIG. 11 is a cross-sectional view taken along line II-IF of FIG. 9.

Other examples of a semiconductor memory device according to the inventive concepts are shown in and will be described with reference to FIGS. 9-11. Again, for brevity, like components of the examples of the semiconductor memory devices according to the inventive concepts are allocated the same reference numerals and a detailed description of such components will not be repeated.

Figure 2:
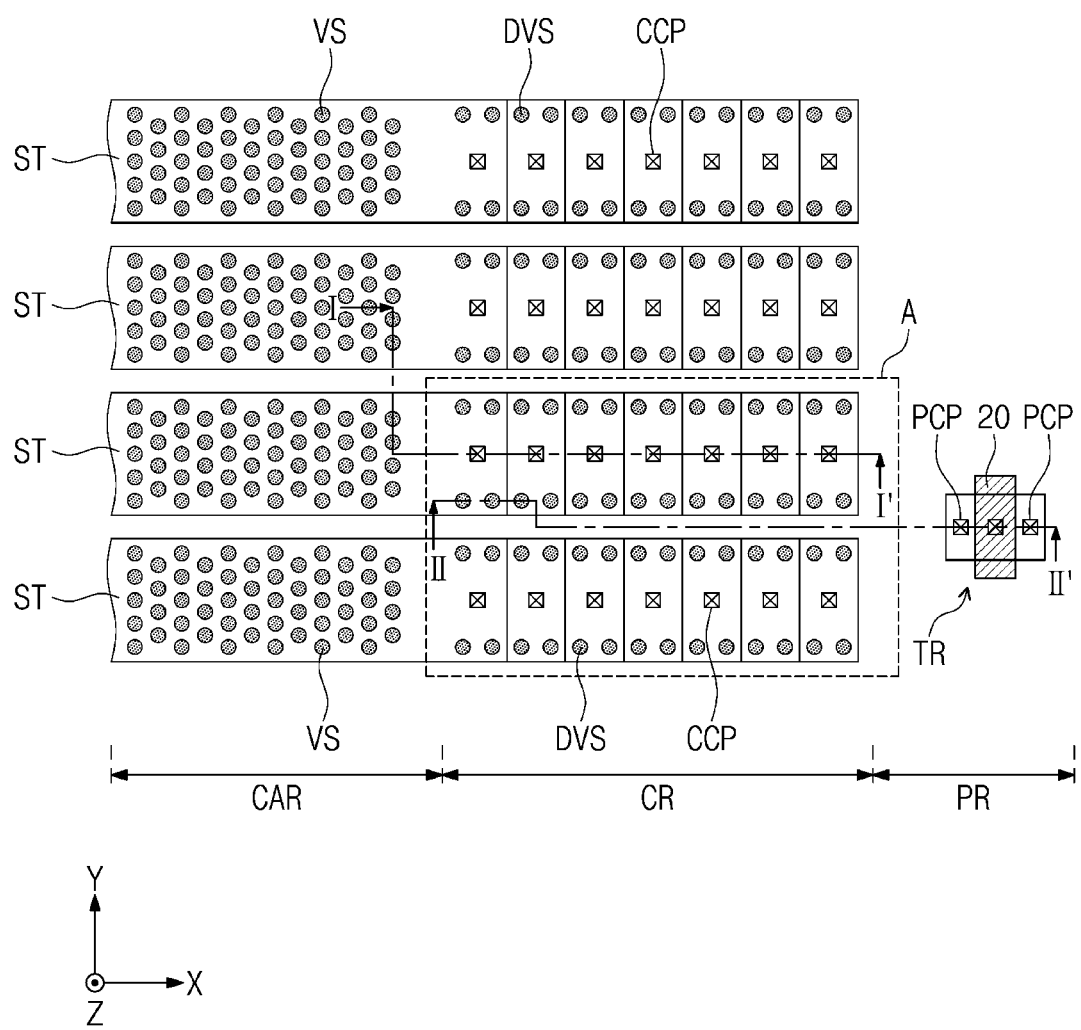
FIG. 2 is a plan view of an example of a semiconductor memory device according to the inventive concepts.
Figure 3:
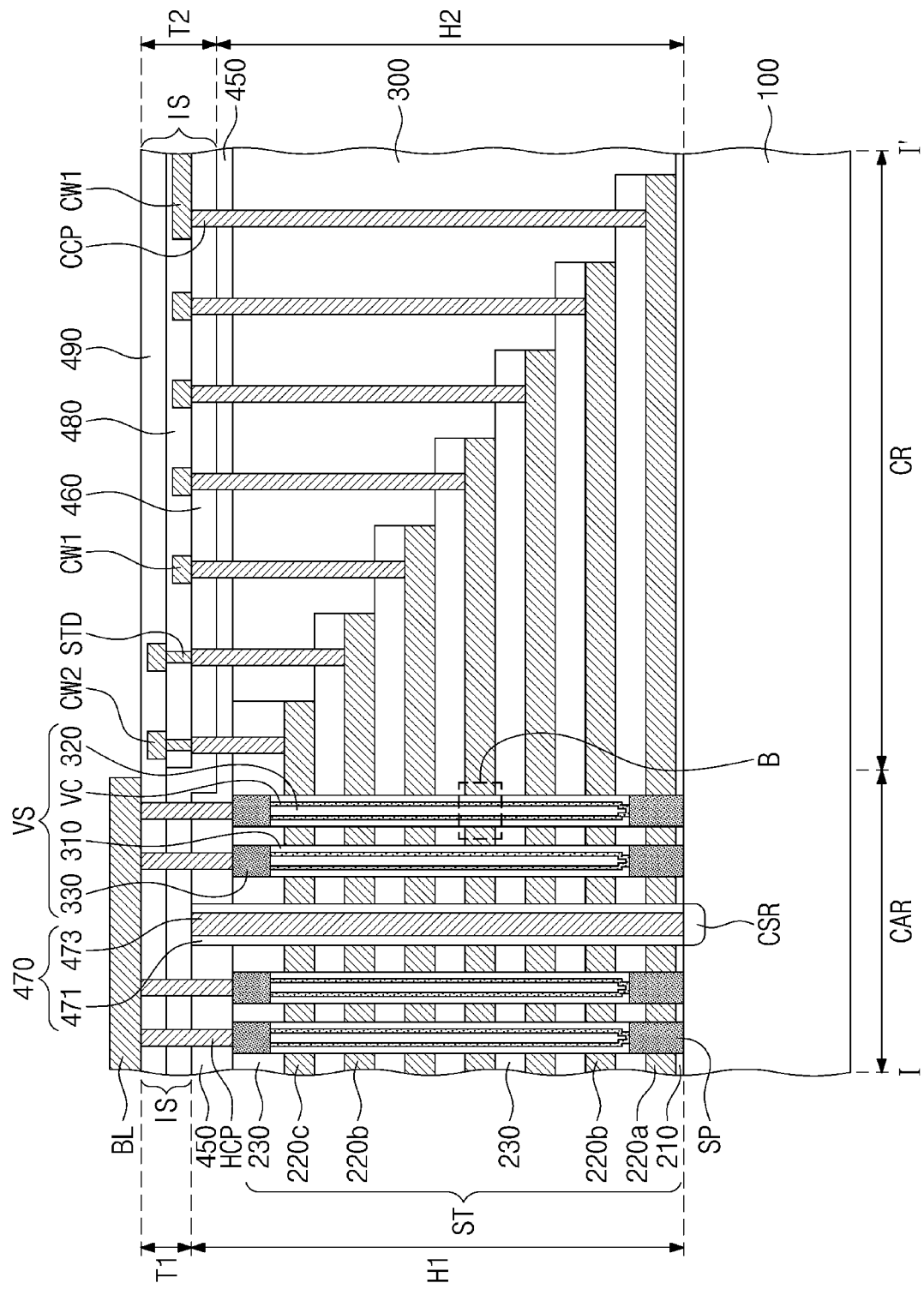
FIG. 3 is a cross-sectional view of one of such examples as taken along line I-I' of FIG. 2.
Figure 4:
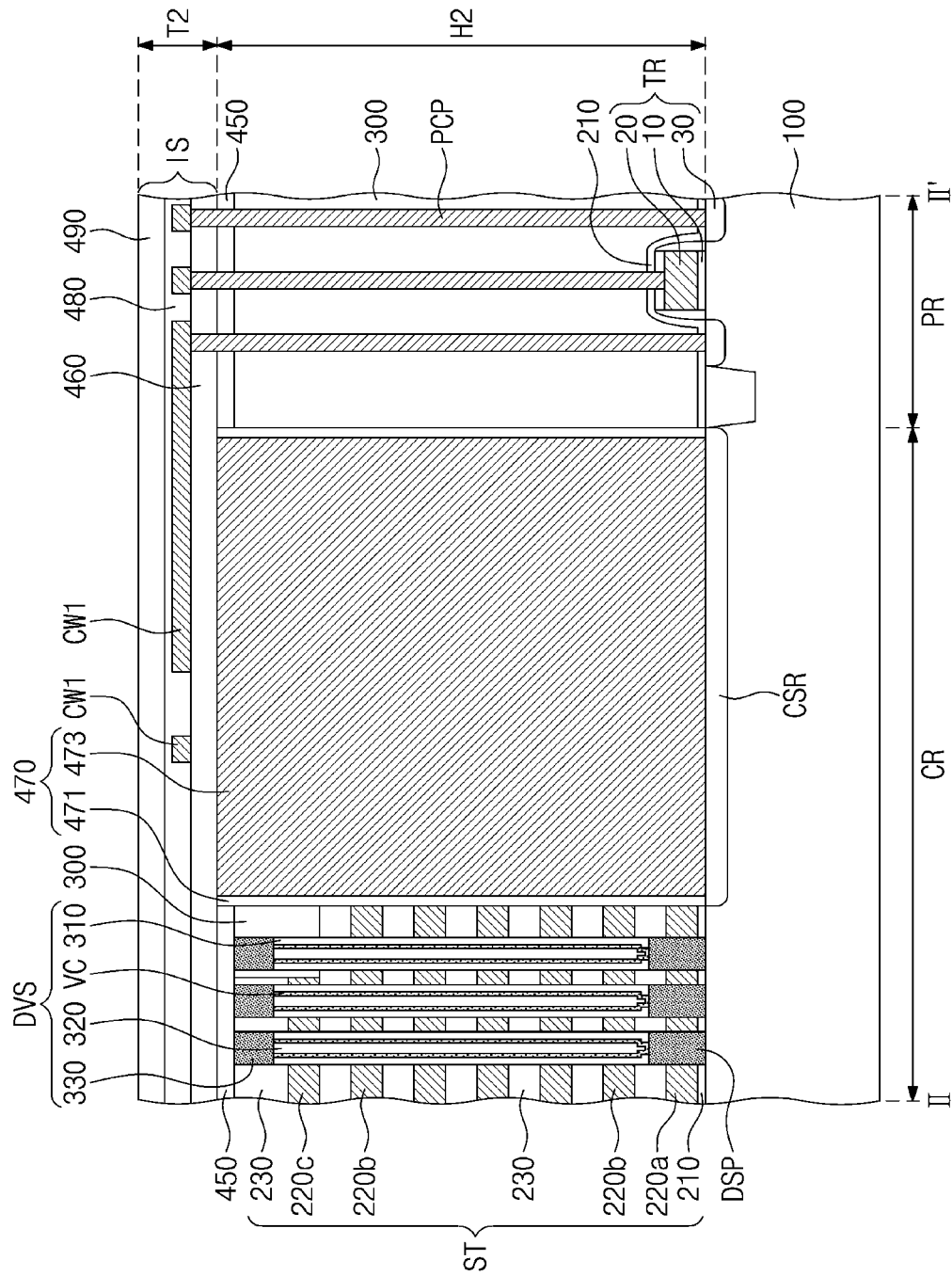
FIG. 4 is a cross-sectional view taken along line II-IF of FIG. 2.

The semiconductor memory device shown in FIGS. 9 to 11 does not include the dummy vertical channel structures DVS shown in and described with reference to FIGS. 2 and 4. In this case, the top surface of the contact structure 470 on the contact region CR is situated at a level lower than that of the top surfaces of the cell vertical channel structures VS. The top surface of the interlayer dielectric pattern 300 is situated at a level lower than that of the top surfaces of the cell vertical channel structures VS.

Another example of a semiconductor memory device according to the inventive concepts is shown in and will be described with reference to FIGS. 12-14. Again, for brevity, like components of the examples of the semiconductor memory devices according to the inventive concepts are allocated the same reference numerals and a detailed description of such components will not be repeated.

Figure 12:
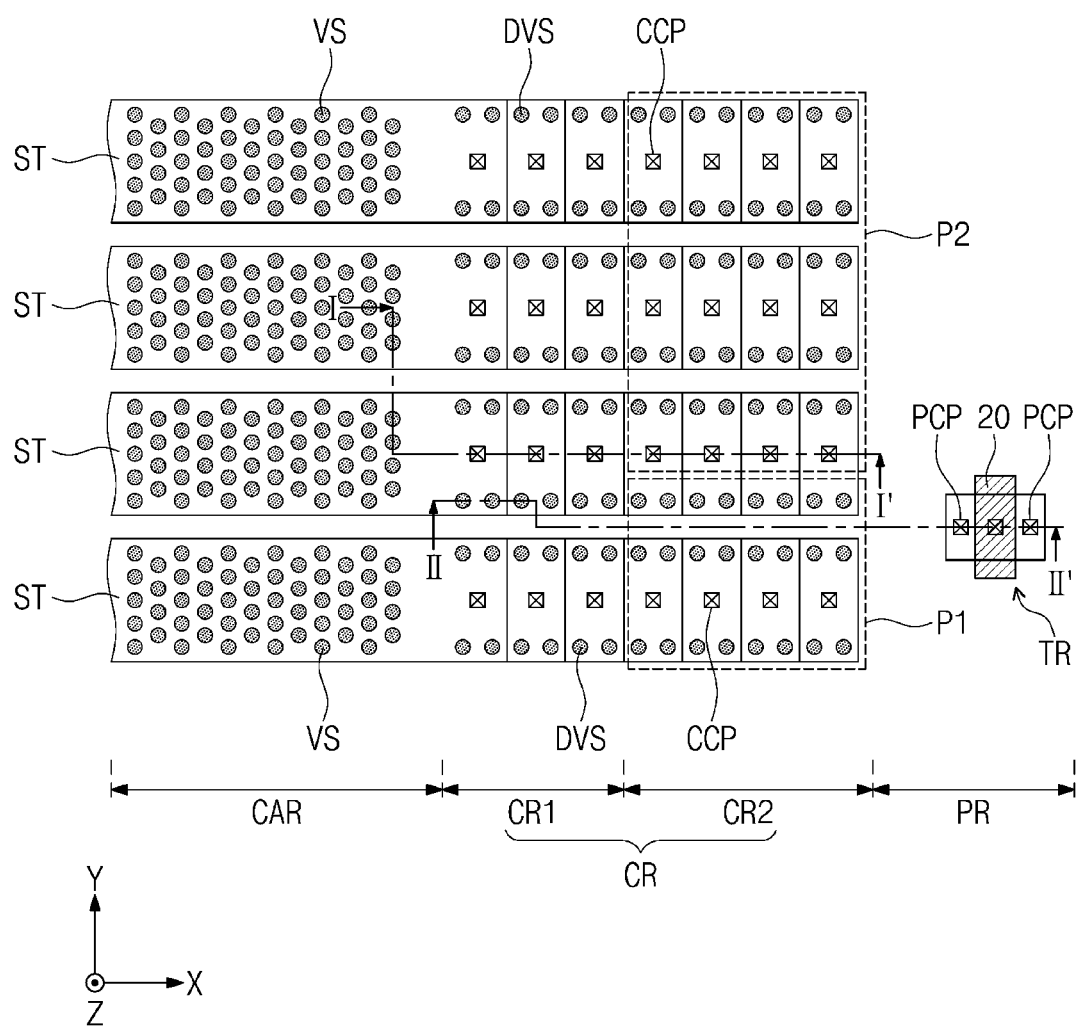
FIG. 12 is a plan view of still another example of a semiconductor memory device according the inventive concepts.
Figure 13:
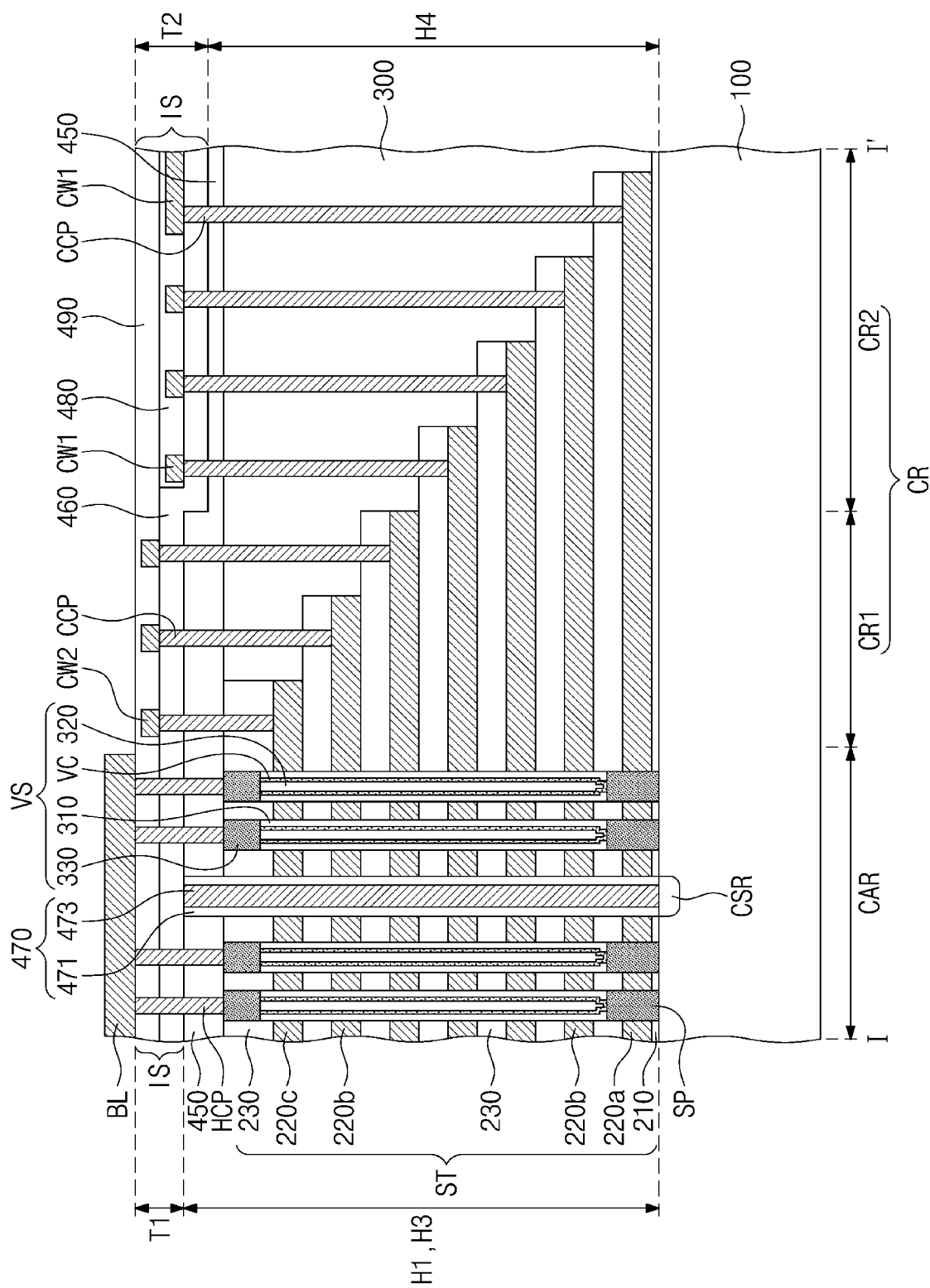
FIG. 13 is a cross-sectional view taken along line I-I' of FIG. 12.
Figure 14:
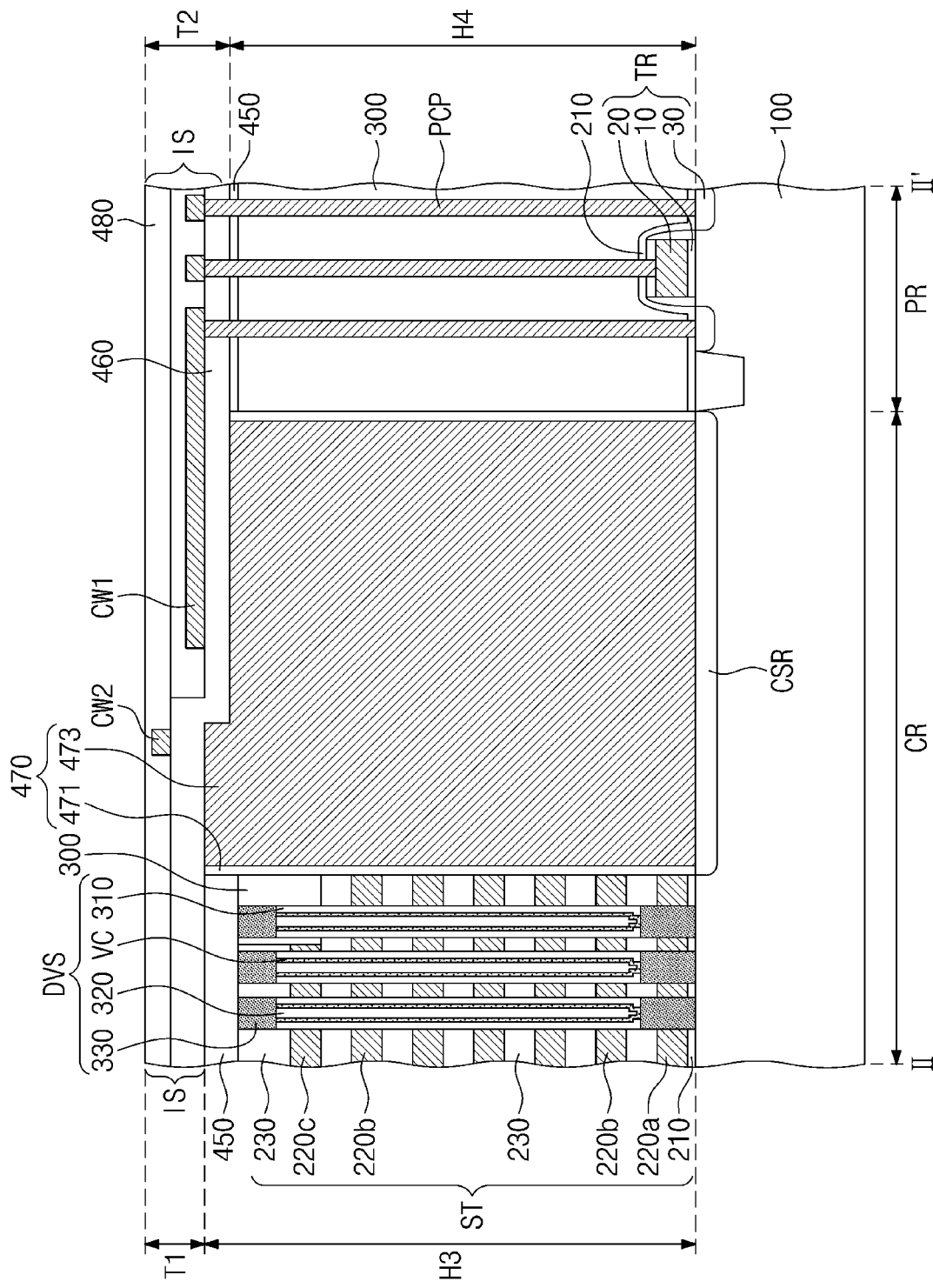
FIG. 14 is a cross-sectional view taken along line II-IF of FIG. 12.

Referring to FIGS. 12 to 14, the contact region CR of the substrate 100 may include a first contact region CR1 and a second contact region CR2. The first contact region CR1 may be adjacent to the cell array region CAR, and the second contact region CR2 may be adjacent to the peripheral circuit region PR. The end of the string select gate electrode 220c and the ends of respective ones of the cell gate electrodes 220b may be provided on the first contact region CR1, and the end of the ground select gate electrode 220a and the ends of remaining ones of the cell gate electrodes 220b may be provided on the second contact region CR2.

The contact structure 470 may have a third height H3 on the first contact region CR1 and a first height H1 on the cell array region CAR, which first and third heights H1 and H3 may be the same (H1=H3). On the other hand, in this example, the contact structure 470 has different heights on the contact region CR of the substrate 100. The contact structure 470 may have a fourth height H4 on the second contact region CR2, which fourth height H4 may be less than the first height H1 (H4<H1). That is, the third height H3 may be greater than the fourth height H4 (H3>H4). The top surface of the contact structure 470 on the first contact region CR1 may be situated at a level higher than that of the top surface of the contact structure 470 on the second contact region CR2. The top surface of the first interlayer dielectric layer 450 on the first contact region CR1 may be located at the same level as that of the top surface of the contact structure 470 on the cell array region CAR, that of the top surface of the contact structure 470 on the first contact region CR1, and that of the top surface of the first interlayer dielectric layer 450 on the cell array region CAR. The top surface of the first interlayer dielectric layer 450 on the second contact region CR2 and the peripheral circuit region PR may be located at the same level as that of the top surface of the contact structure 470 on the second contact region CR2.

Also, the second contact region CR2 may include a first section P1 and a second section P2 that is adjacent in the second direction Y to the first section P1. The contact structure 470 having the fourth height H4 may be disposed locally on the first section P1 of the second contact region CR2. For example, the contact structure 470 on the second section P2 of the second contact region CR2 may have the first height H1 and the third height H3.

In another example, the contact structure 470 having the fourth height H4 may extend across the entirety of the second contact region CR2.

The top surfaces of the cell contact plugs CCP on the first contact region CR1 may be situated at a level higher than that of the top surfaces of the cell contact plugs CCP on the second contact region CR2. In this example, a semiconductor memory device according to the inventive concepts does not include studs STD as in the example shown in and described with reference to FIGS. 2 and 4. For example, the cell contact plugs CCP on the second contact region CR2 may contact the second connection lines CW2.

Figure 15:
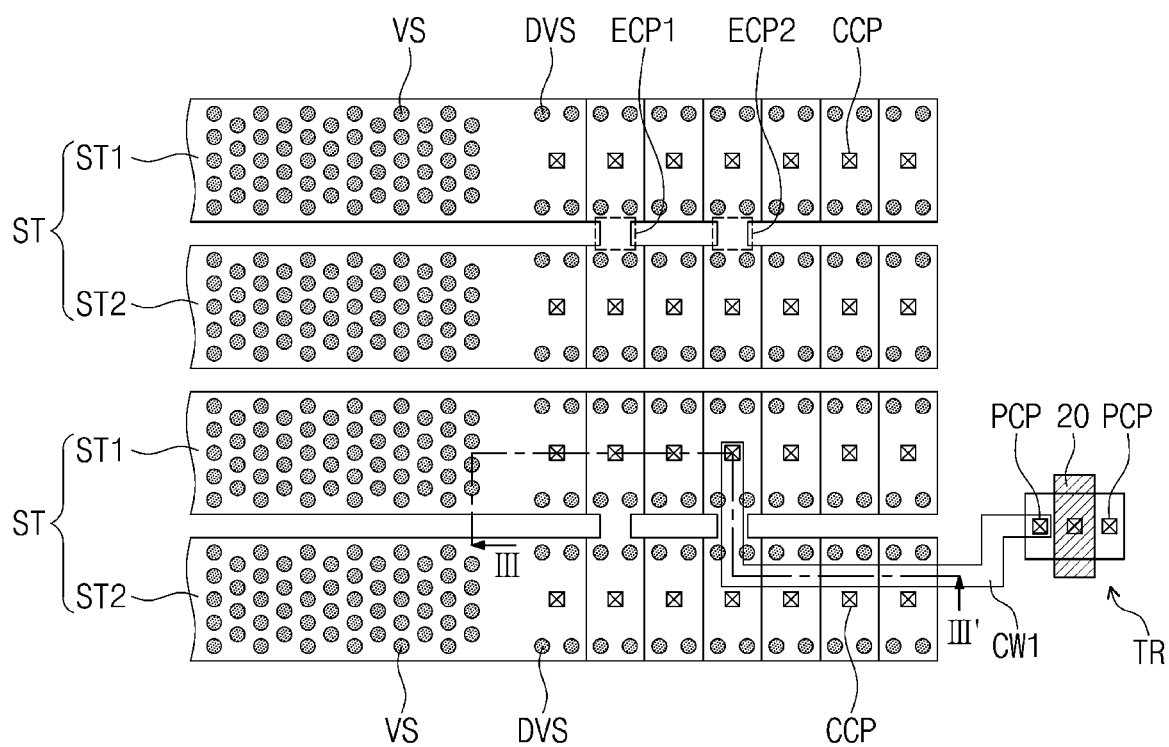
FIG. 15 is a plan view of still another example of a semiconductor memory device according to the inventive concepts.
Figure 16:
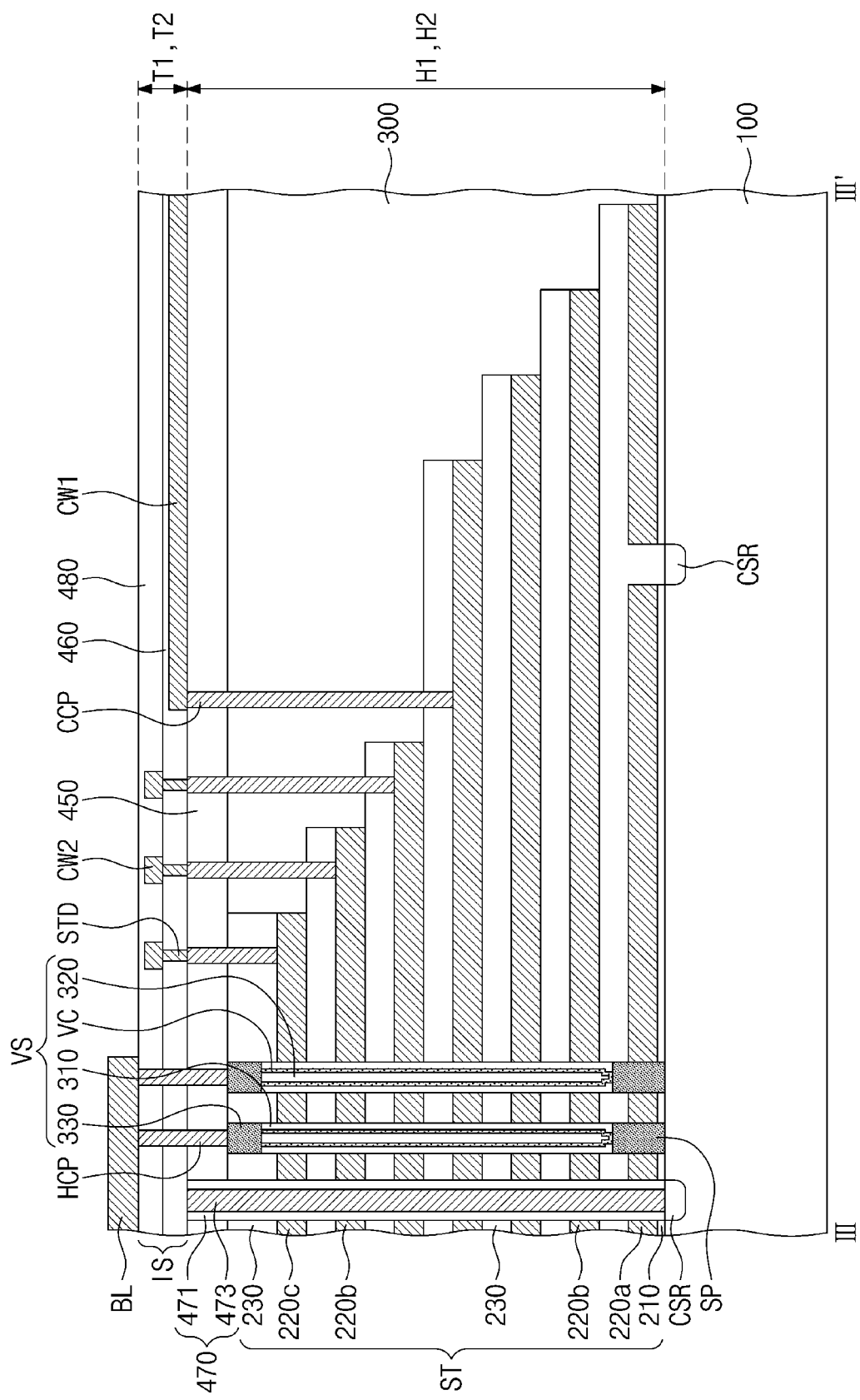
FIG. 16 is a cross-sectional view taken along line of FIG. 15.

Another example of a semiconductor memory device according to the inventive concepts is shown in FIGS. 15 and 16. Again, for brevity, like components of the examples of the semiconductor memory devices according to the inventive concepts are allocated the same reference numerals and a detailed description of such components will not be repeated.

Referring to FIGS. 15 and 16, a plurality of pairs of stack structures ST are disposed on the cell array region CAR and the contact region CR of the substrate 100. Each pair of stack structures ST includes a first stack structure ST1 and a second stack structure ST2 spaced apart from each other in the second direction Y on the top surface of the substrate 100.

The contact structure 470 may be disposed between the first stack structure ST1 and the second stack structure ST2. In an example, the contact structure 470 has a first height H1 on the cell array region CAR and a second height H2 on the contact region CR, which first and second heights H1 and H2 are the same (H1=H2). The contact structure 470 may physically and electrically separate the string select gate electrode 220c of the first stack structure ST1 from the string select gate electrode 220c of the second stack structure ST2. In a pair of stack structures ST, a lowermost one of the insulating patterns 230 may be interposed between the ground select gate electrode 220a of the first stack structure ST1 and the ground select gate electrode 220a of the second stack structure ST2. In a pair of stack structures ST, the lowermost insulating pattern 230 and the contact structure 470 may physically and electrically separate the ground select gate electrode 220a of the first stack structure ST1 from the ground select gate electrode 220a of the second stack structure ST2.

Each pair of stack structures ST may also include a first electrode connection ECP1 and a second electrode connection ECP2. The first and second electrode connections ECP1 and ECP2 may be disposed between the first stack structure ST1 and the second stack structure ST2. The first and second electrode connections ECP1 and ECP2 may be spaced apart from each other. When viewed in plan, the first electrode connection ECP1 may be disposed between uppermost ones of the cell gate electrodes 220b of the first and second stack structures ST1 and ST2. When viewed in plan, the second electrode connection ECP2 may be disposed between one of the cell gate electrode 220b of the first stack structure ST1 and one of the cell gate electrodes 220b of the second stack structure ST2, which one cell gate electrode 220b of the second stack structure ST2 may be located at the same level as that of the one cell gate electrode 220b of the first stack structure ST1.

The first and second electrode connections ECP1 and ECP2 may connect the cell gate electrodes 220b that face each other in the second direction Y and are located at the same level. For example, the cell gate electrodes 220b of the first and second stack structures ST1 and ST2 that are situated at the same level may be at the same potential owing to the first electrode connection ECP1 or the second electrode connection ECP2. The number of the first and second electrode connections ECP1 and ECP2 is be limited to that shown. Rather, three or more electrode connections may be provided.

The cell contact plugs CCP may be disposed on the ends of the gate electrodes 220a, 220b, and 220c of the first and second stack structures ST1 and ST2. The top surfaces of the cell contact plugs CCP may be located at the same level as that of the top surface of the contact structure 470. The cell contact plugs CCP may be connected to the first and second connection lines CW1 and CW2. Ones of the cell contact plugs CCP may be connected to the first connection lines CW1. Others of the cell contact plugs CCP may be connected through the studs STD to the second connection lines CW2.

In an example, the first connection lines CW1 pass over the first and second electrode connections ECP1 and ECP2 and then extend onto the peripheral circuit region PR of the substrate 100. For example, as shown in FIG. 15, the first connection line CW1 connected to one of the cell contact plugs CCP pass over the second electrode connection ECP2 and then extend onto the peripheral circuit region PR, with the result that the first connection line CW1 are electrically connected to one peripheral circuit transistor TR. In this case, the first connection line CW1 passing over the second electrode connection ECP2 may have a width less than that of the second electrode connection ECP2. Although not shown, one of the first connection lines CW1 may pass over the first electrode connection ECP1, and another of the first connection lines CW1 may pass over the second electrode connection ECP2. The first connection lines CW1 may be spaced apart from the contact structure 470.

The interlayer dielectric structure IS may include the second and third interlayer dielectric layers 460 and 480 that are stacked on the first interlayer dielectric layer 450. In an example, the interlayer dielectric structure IS has a first thickness T1 on the cell array region CAR and a second thickness T2 on the contact region CR, which first and second thicknesses T1 and T2 are the same (T1=T2).

A method of fabricating a semiconductor memory device according to the inventive concepts will next be described with reference to FIGS. 17A to 23A.

Figure 17B:
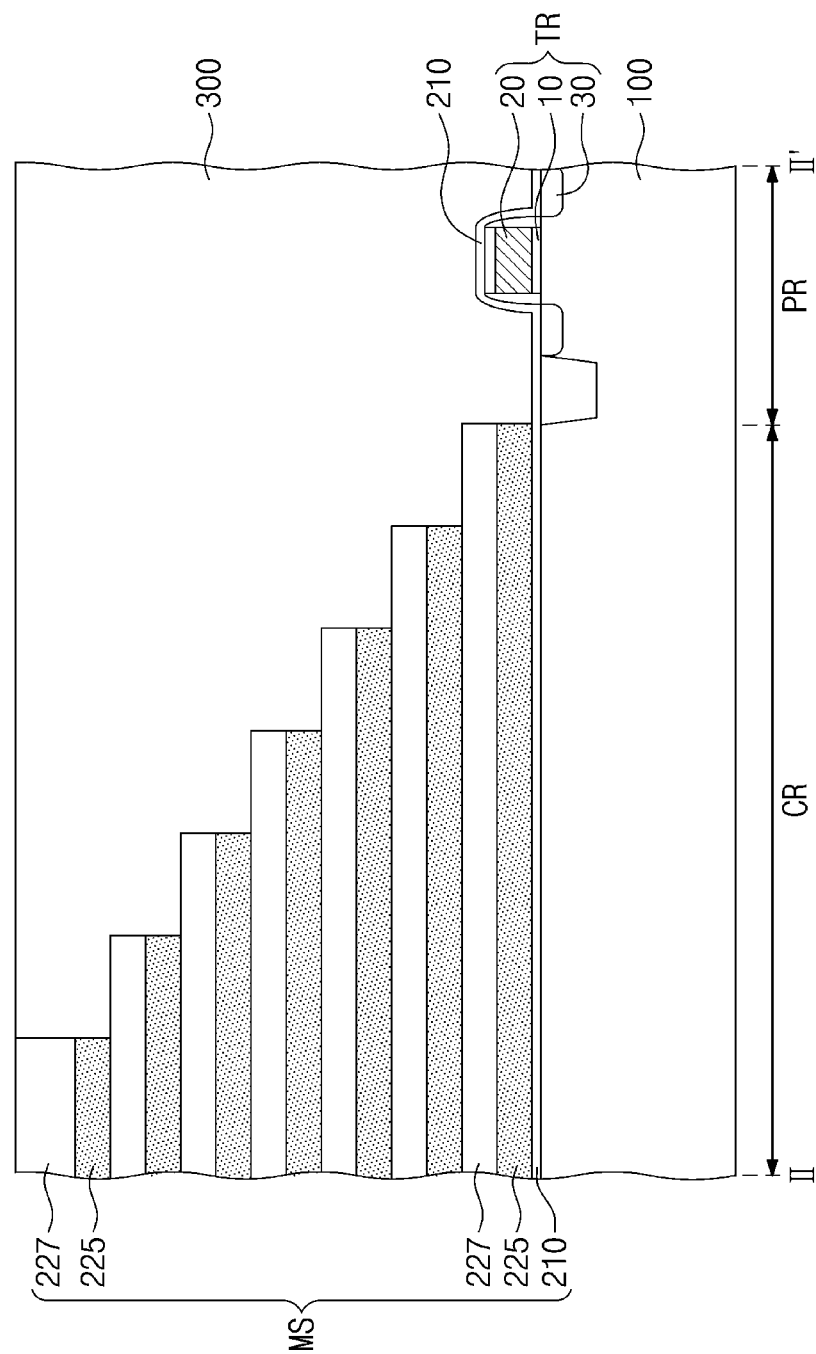

Referring to FIGS. 17A and 17B, a device isolation layer may be provided in a substrate 100. The device isolation layer may define an active region of the substrate 100. A peripheral circuit transistor TR may be provided on the active region of the substrate 100. The substrate 100 may include a cell array region CAR, a contact region CR, and a peripheral circuit region PR between the cell array region CAR and the contact region CR. The peripheral circuit transistor TR may be disposed on the peripheral circuit region PR of the substrate 100. The peripheral circuit transistor TR may include a peripheral gate dielectric layer 10, a peripheral gate electrode 20, and source/drain regions 30. The peripheral gate dielectric layer 10 and the peripheral gate electrode 20 may be sequentially formed on the substrate 100. The source/drain regions 30 may be formed in the active region of the substrate 100 on opposite sides of the peripheral gate electrode 20.

A mold structure MS may be formed on the substrate 100. The forming of the mold structure MS may include forming a buffer oxide layer 210 on the substrate 100, and then alternately and repeatedly stacking sacrificial layers 225 and insulating layers 227 on the buffer oxide layer 210. On the peripheral circuit region PR of the substrate 100, the buffer oxide layer 210 may cover a surface of the peripheral circuit transistor TR. The buffer oxide layer 210 may comprise a thermal oxide layer or a silicon oxide layer. The sacrificial layers 225 may comprise a silicon nitride layer. The insulating layers 227 may be formed of a material exhibiting an etch selectivity to the sacrificial layers 225. The insulating layers 227 may comprise a silicon oxide layer.

The mold structure MS may be patterned to have a stepped or "staircase" structure on the contact region CR of the substrate 100. The patterning of the mold structure MS may include forming on the mold structure MS a mask pattern (not shown) exposing a portion of the mold structure MS, which portion is formed on the contact region CR and the peripheral circuit region PR of the substrate 100, and then repeatedly performing both an etching process in which the mask pattern is used as an etching mask to etch the insulating layers 227 and the sacrificial layers 225 and a process in which a width of the mask pattern is reduced to increase etching-target planar areas of the insulating layers 227 and the sacrificial layers 225. On the peripheral circuit region PR of the substrate 100, the buffer oxide layer 210 may be exposed by the mold structure MS. The insulating layers 227 may have ends whose top surfaces are exposed on the contact region CR of the substrate 100. The sacrificial layers 225 may have lengths in a first direction (the X direction in FIG. 2) that decrease with increasing distance from the substrate 100, and the insulating layers 227 may have lengths in the first direction X that decrease with increasing distance from the substrate 100. A pair of the sacrificial layer 225 and the insulating layer 227 vertically adjacent to each other may have the same length in the first direction X.

An interlayer dielectric pattern 300 may be formed to cover the stepwise structure of the mold structure MS and the buffer oxide layer 210. The interlayer dielectric pattern 300 may expose a top surface of the mold structure MS. The interlayer dielectric pattern 300 may comprise a tetraethylorthosilicate (TEOS) oxide layer.

Figure 18A:
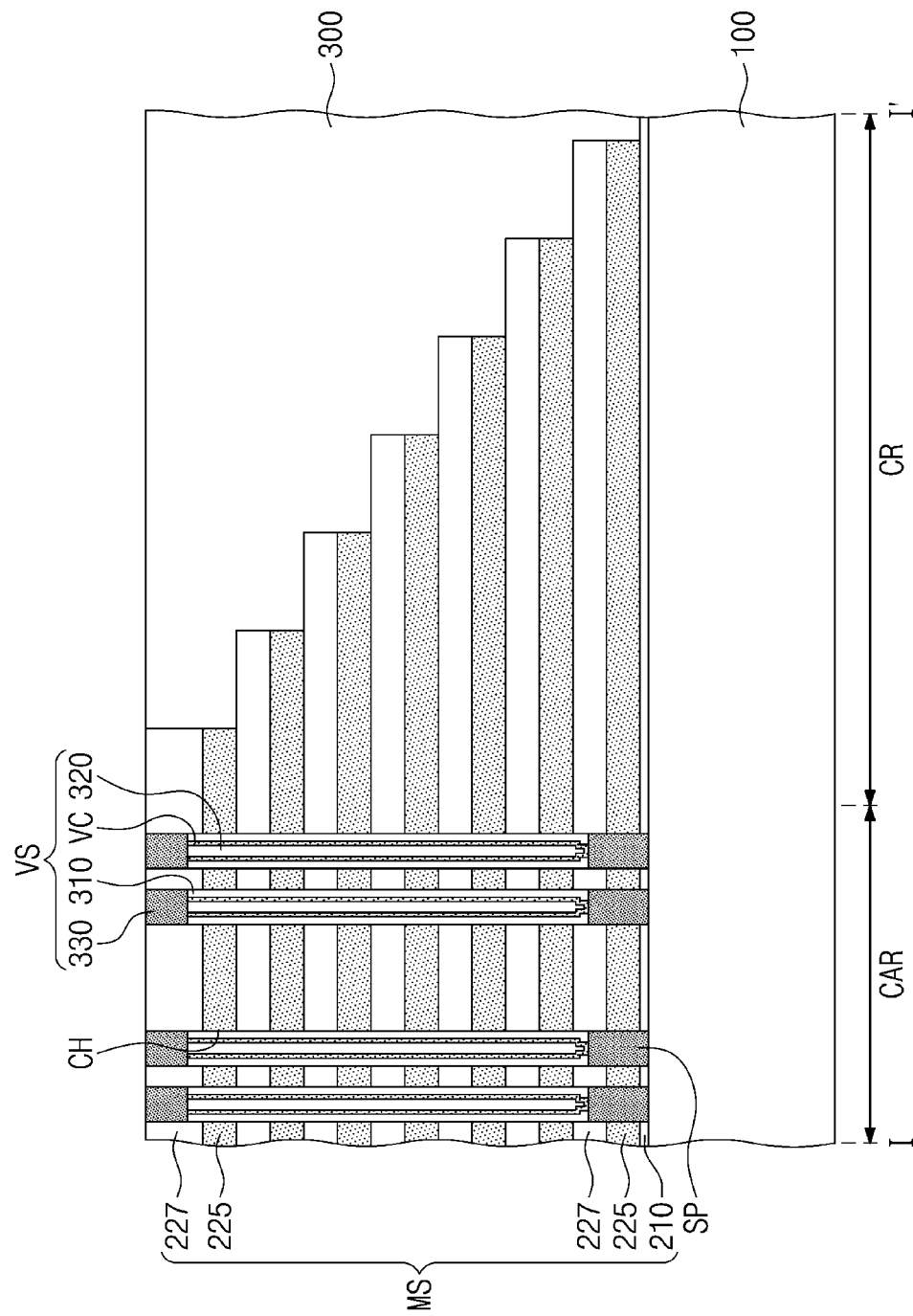
Figure 18B:
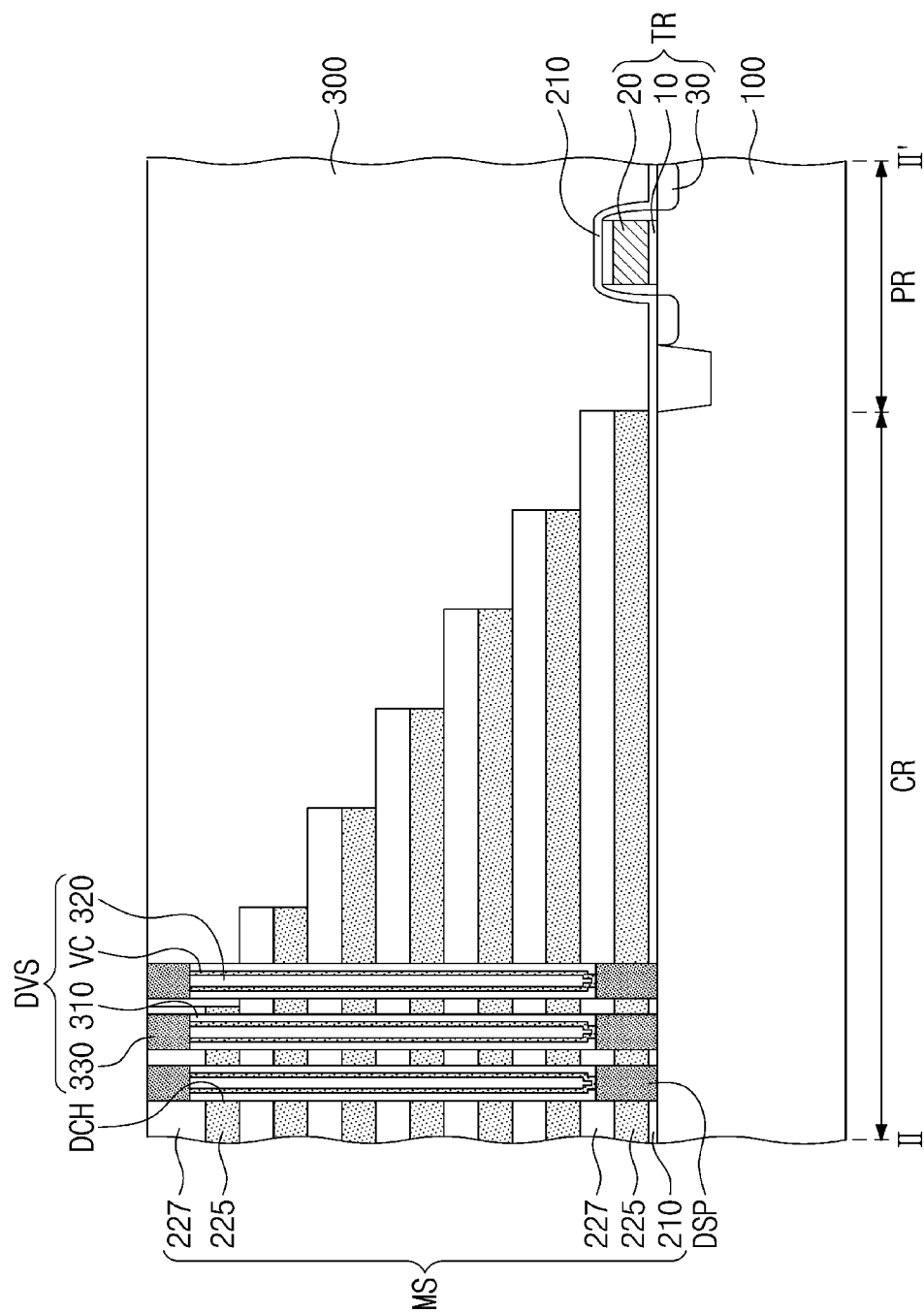

Referring to FIGS. 18A and 18B, the mold structure MS and the buffer oxide layer 210 may be patterned to form channel holes CH and dummy channel holes DCH in the mold structure MS. The channel holes CH may be formed on the cell array region CAR of the substrate 100, and the dummy channel holes DCH may be formed on the contact region CR of the substrate 100. For example, the forming of the channel holes CH and the dummy channel holes DCH may include forming a mask pattern (not shown) on the mold structure MS and the interlayer dielectric pattern 300, and then using the mask pattern as an etching mask to anisotropically etch the mold structure MS. An over-etching action may be carried out such that the substrate 100 may be etched to have a recessed top surface. The channel holes CH and the dummy channel holes DCH may have circular shapes, oval shapes, or polygonal shapes when viewed in plan.

Semiconductor pillars SP may be formed in the channel holes CH, and the dummy semiconductor pillars DSP may be formed in the dummy channel holes DCH. A selective epitaxial growth technique may be used to grow the semiconductor pillars SP and the dummy semiconductor pillars DSP from the substrate 100, which serves as a seed, exposed to the channel holes CH and the dummy channel holes DCH. Each of the semiconductor pillars SP and of the dummy semiconductor pillars DSP may include a material whose directionality is the same as that of the substrate 100.

Charge storage structures 310 may be formed along sides of the channel holes CH and of the dummy channel holes DCH. The charge storage structures 310 may line the sides of the channel holes CH and of the dummy channel holes DCH, and also partially cover the semiconductor pillars SP and the dummy semiconductor pillars DSP respectively formed in the channel holes CH and the dummy channel holes DCH.

As shown in FIG. 6, each of the charge storage structures 310 may include a blocking insulating layer BLL, a charge storage layer CTL, and a tunnel insulating layer TL that are sequentially formed in each of the channel hole CH and the dummy channel hole DCH. For example, the blocking insulating layer BLL may include a silicon oxide layer or a high-k dielectric layer (e.g., $Al_2O_3$ or $HfO_2$), the charge storage layer CTL may include a silicon nitride layer, and the tunnel insulating layer TL may include a silicon oxynitride layer or a high-k dielectric layer (e.g., $Al_2O_3$ or $HfO_2$).

Vertical channels VC may be formed in the channel holes CH and the dummy channel holes DCH. The vertical channels VC may conformally cover inner side surfaces of the charge storage structures 310 and top surfaces of the semiconductor pillars SP and the dummy semiconductor pillars DSP, which top surfaces are exposed by the charge storage structures 310. The vertical channels VC may experience a hydrogen annealing process under a gaseous environment including hydrogen or deuterium. The hydrogen annealing process may cure crystalline defects present in the vertical channels VC.

Gap-fill layers 320 may be formed in inner spaces surrounded by the vertical channels VC. The gap-fill layers 320 may completely fill the channel holes CH and the dummy channel holes DCH. An SOG technique may be used to form the gap-fill layer 320. The gap-fill layers 320 are of an insulating material such as silicon oxide.

Pads 330 may be formed on upper portions of the vertical channels VC, of the charge storage structures 310, and of the gap-fill layers 320. The forming of the pads 330 may include forming recesses by etching upper portions of the vertical channels VC, of the charge storage structures 310, and of the gap-fill layers 320, and then filling the recesses with a conductive material. Alternatively, the pads 330 may be formed by doping the upper portions of the vertical channels VC with impurities whose conductivity is different from that of the vertical channels VC. Accordingly, cell vertical channel structures VS may be formed on the cell array region CAR, and dummy cell vertical channel structures DVS may be formed on the contact region CR. Each of the cell vertical channel structures VS and of the dummy vertical channel structures DVS may include the vertical channel VC, the charge storage structure 310, the gap-fill layer 320, and the pad 330.

Figure 19A:
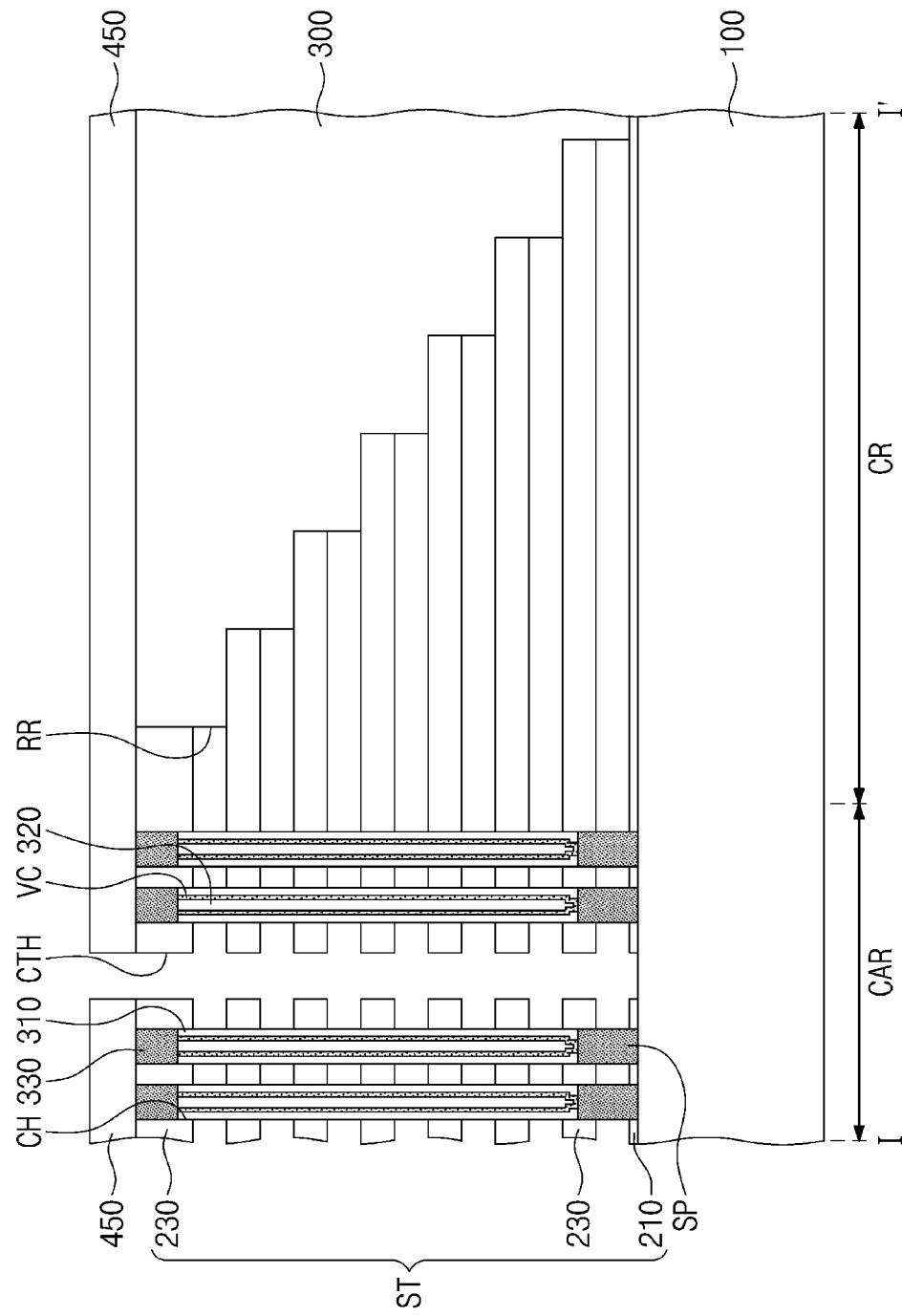
Figure 19B:
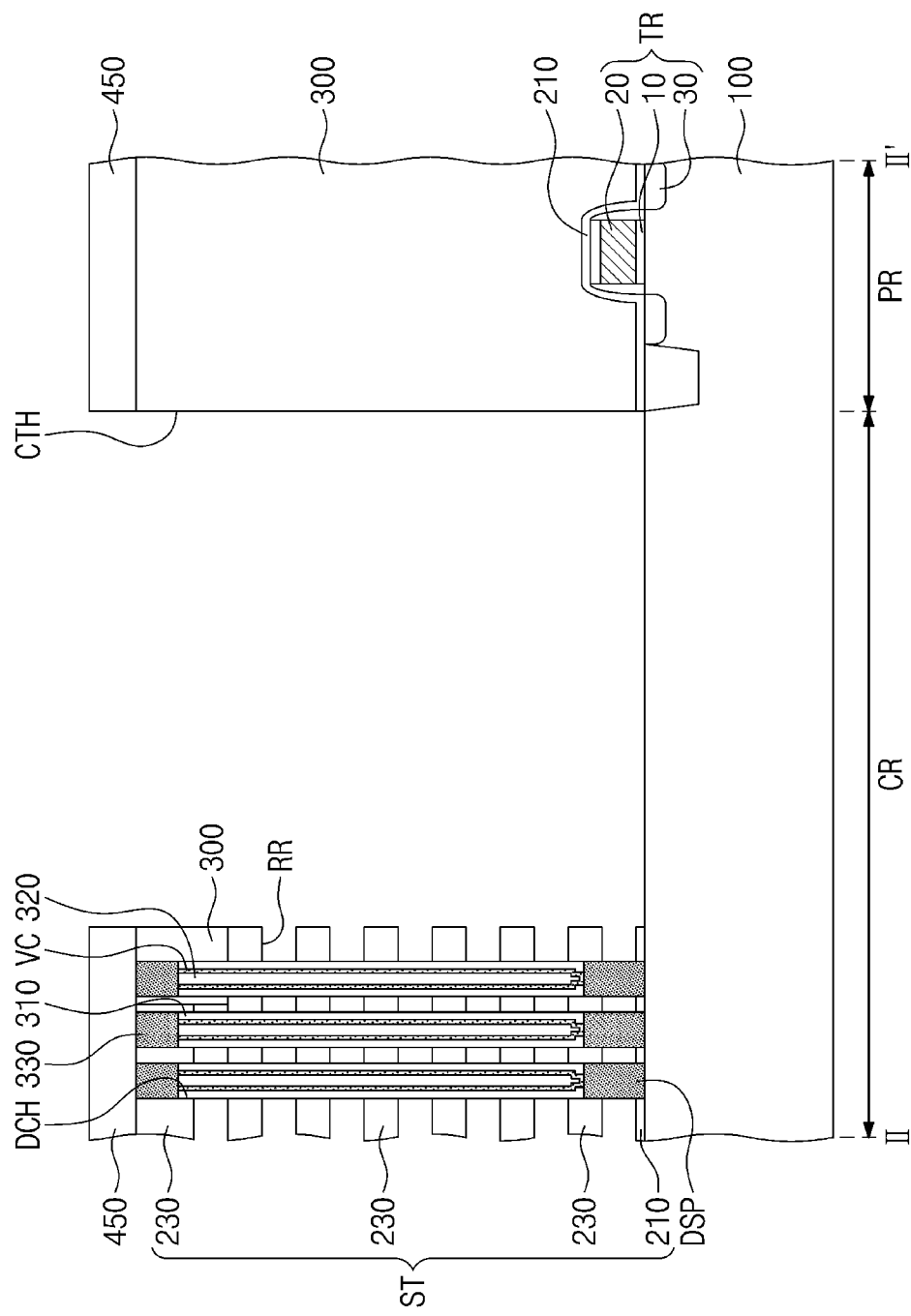

Referring to FIGS. 19A and 19B, the mold structure MS may be anisotropically etched to form a common source trench CTH. The forming of the common source trench CTH may include forming a first interlayer dielectric layer 450 on the mold structure MS, and then using the first interlayer dielectric layer 450 as an etching mask to pattern the mold structure MS and the buffer oxide layer 210 until the top surface of the substrate 100 is exposed. The common source trench CTH may be formed to extend in the first direction (the X direction in FIG. 2). The common source trench CTH may then be formed to have a linear or rectangular shape extending in the first direction X. The common source trench CTH may delimit stack structures ST that are spaced apart from each other in a second direction (the Y direction in FIG. 2) on the top surface of the substrate 100. Each of the stack structures ST may include a patterned buffer oxide layer 210, insulating patterns 230, and sacrificial patterns (not shown). Sides of the stack structures ST may be exposed by the common source trench CTH.

Recess regions RR may be formed by removing the sacrificial patterns exposed to the common source trench CTH. The sacrificial patterns may be removed by a wet etching process and/or an isotropic dry etching process. The recess regions RR may be formed between the insulating patterns 230 vertically adjacent to each other and between the buffer oxide layer 210 and a lowermost one of the insulating patterns 230. The etching process may use an etchant including phosphoric acid.

Recess regions RR may extend horizontally from the common source trench CTH into gaps between the insulating patterns 230. The recess regions RR may expose top and bottom surfaces of the insulating patterns 230, portions of outer walls of the charge storage structures 310, portions of sidewalls of the dummy semiconductor pillars DSP, portions of sidewalls of the semiconductor pillars SP, and portions of the interlayer dielectric pattern 300.

Figure 20A:
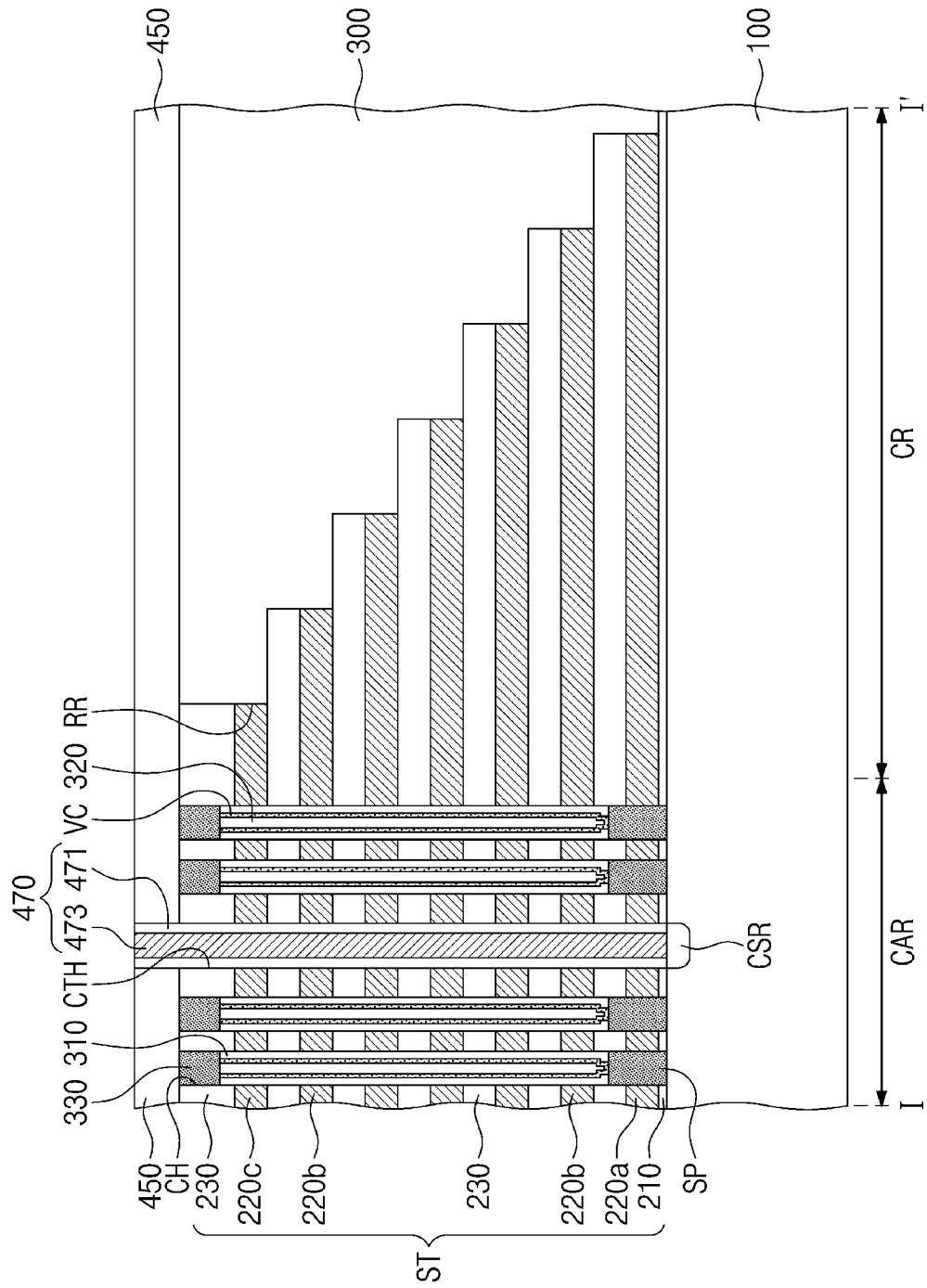
Figure 20B:
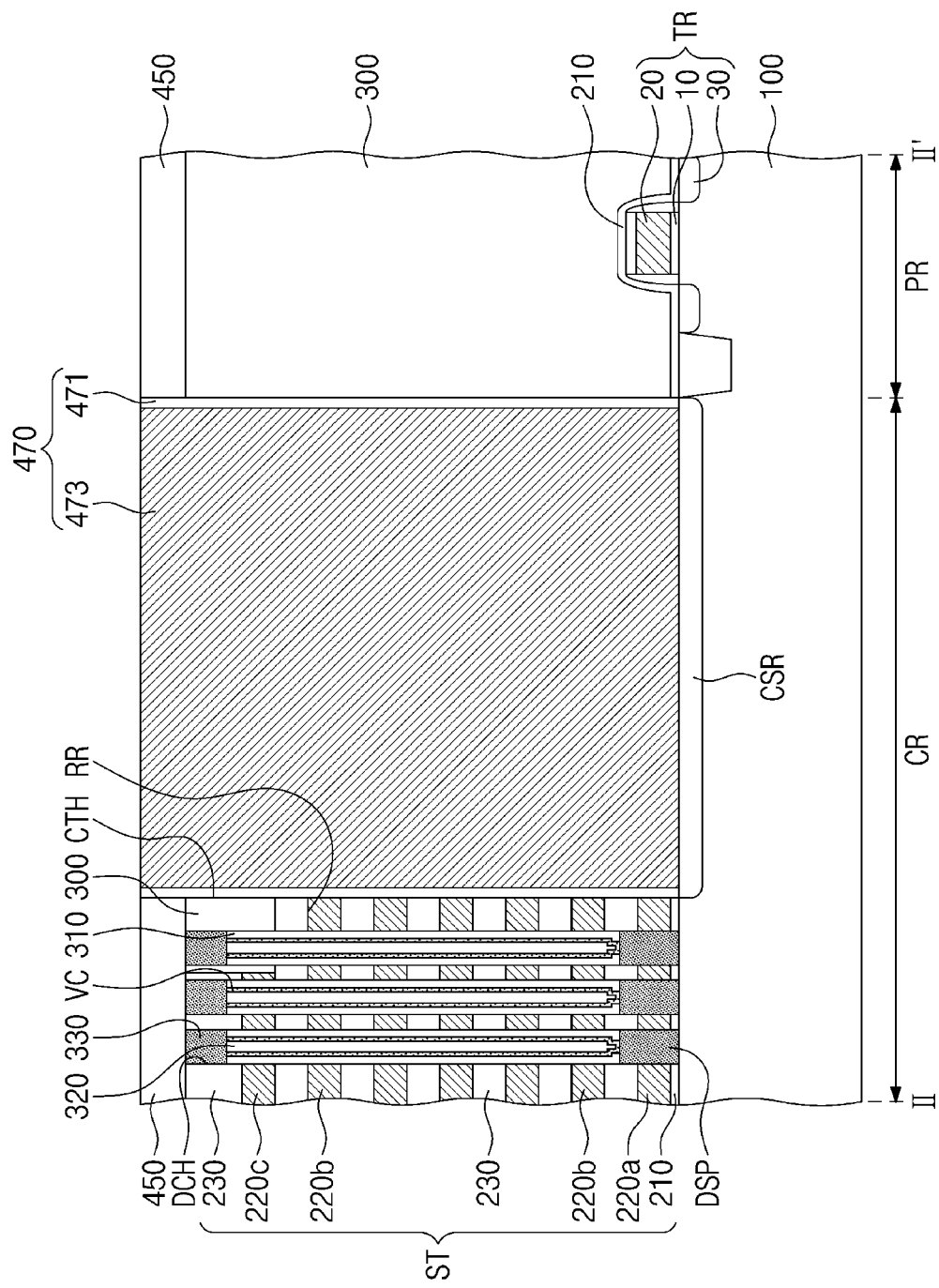

Referring to FIGS. 6, 20A, and 20B, a horizontal insulating layer 340 may be formed in the recess regions RR. For example, the horizontal insulating layer 340 may conformally cover the top and bottom surfaces of the insulating patterns 230, the outer walls of the charge storage structures 310 exposed to the recess regions RR, the side surfaces of the dummy semiconductor pillars DSP, the side surfaces of the semiconductor pillars SP, the portions of the interlayer dielectric pattern 300, and a side surface of the first interlayer dielectric layer 450. The horizontal insulating layer 340 may be formed using a deposition process having good step coverage. For example, the horizontal insulating layer 340 may be formed using chemical vapor deposition (CVD) or atomic layer deposition (ALD).

Gate electrodes 220a, 220b, and 220c may be formed in the recess regions RR. The forming of the gate electrodes 220a, 220b, and 220c may include forming a metal layer to fill the common source trench CTH and the recess regions RR, and then removing the metal layer from the common source trench CTH. The gate electrodes 220a, 220b, and 220c may include a ground select gate electrode 220a, cell gate electrodes 220b, and a string select gate electrode 220c.

A common source region CSR may be formed in the substrate 100 exposed to the common source trench CTH. An ion implantation process may be performed to form the common source region CSR. The common source region CSR may have a different conductivity from that of the substrate 100.

A contact structure 470 may be formed in the common source trench CTH. The contact structure 470 may include a spacer 471 and a common source contact 473. The spacer 471 may cover side surfaces of the common source trench CTH. The common source contact 473 may be formed to fill a remaining space of the common source trench CTH in which the spacer 471 is formed.

Figure 21A:
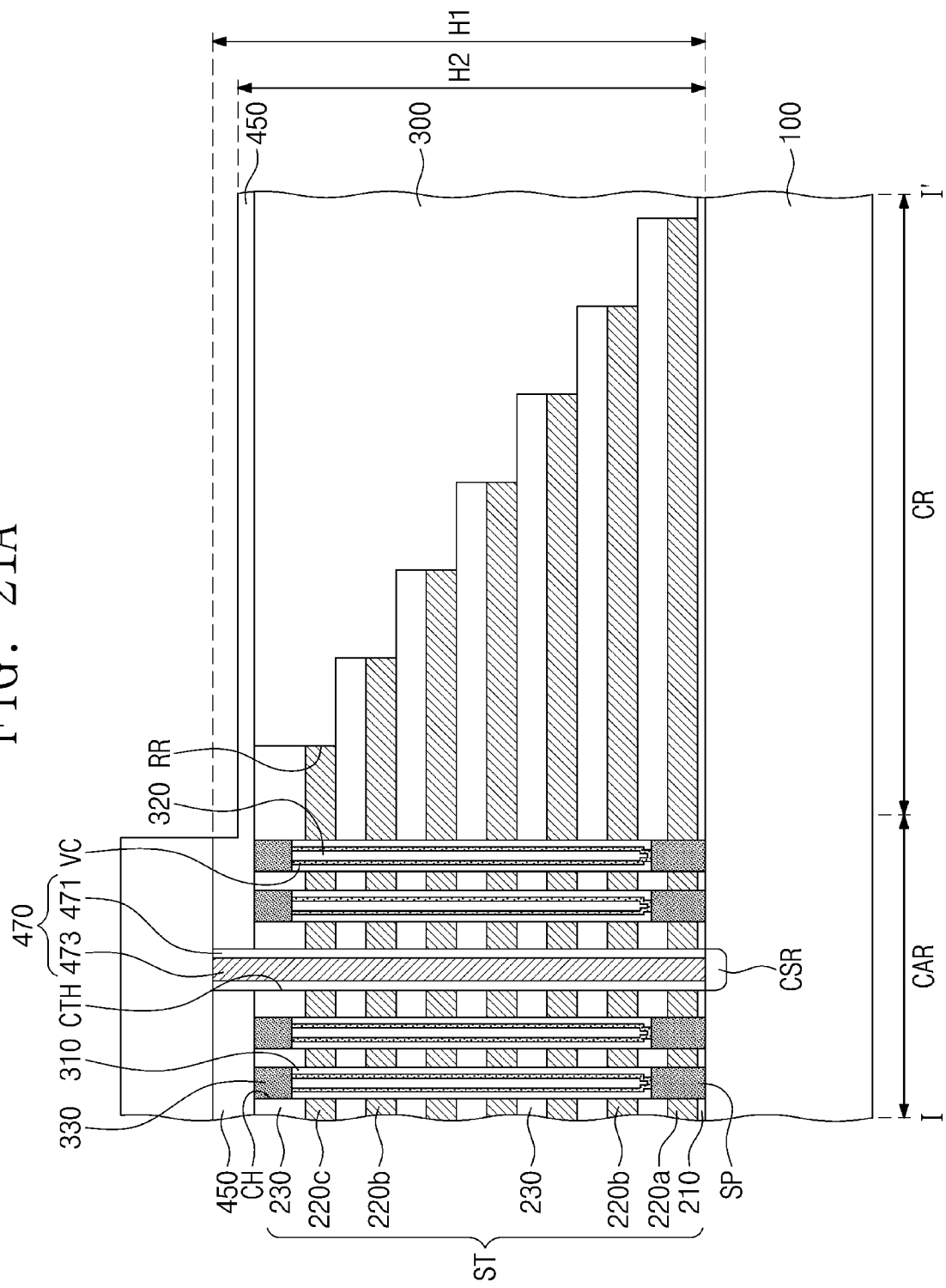
Figure 21B:
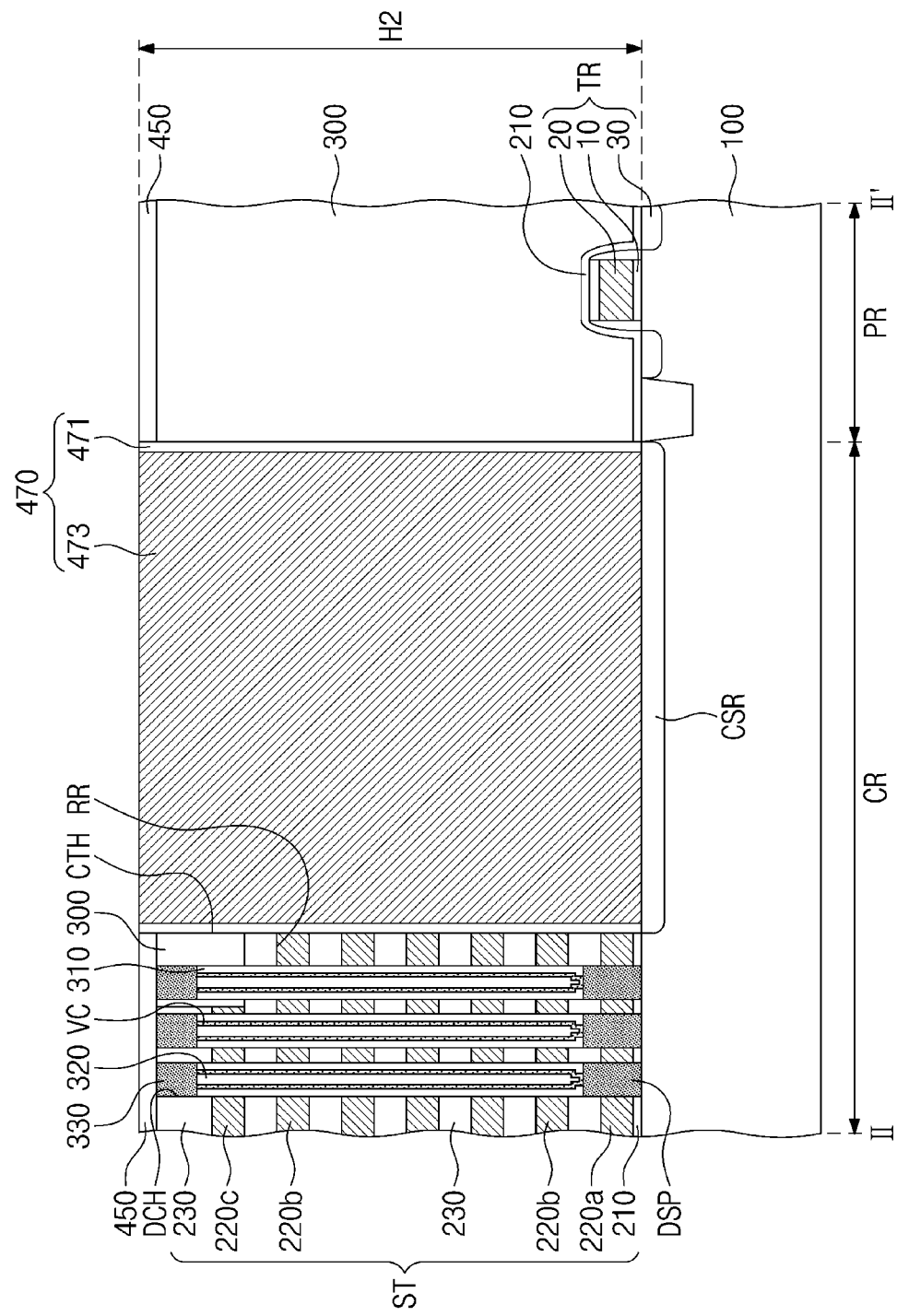

Referring to FIGS. 21A and 21B, an etching process may be performed to etch an upper portion of the contact structure 470 formed on the contact region CR and an upper portion of the first interlayer dielectric layer 450 formed on the contact and peripheral circuit regions CR and PR. The etching process may include forming a mask pattern 475 on the first interlayer dielectric layer 450 disposed on the cell array region CAR and using the mask pattern 475 as an etching mask to etch the contact structure 470 and the first interlayer dielectric layer 450. In an example, the etching process includes a first etch process to etch the spacer 471, a second etch process to etch the common source contact 473, and a third etch process to etch the first interlayer dielectric layer 450, in which the first to third etch processes are discrete from each other, i.e., have different etch recipes. Alternatively, the etching process may consist of a single etch process that etches the spacer 471, the common source contact 473, and the first interlayer dielectric layer 450 (using a single etch recipe). The etching process may be, for example, a dry etching process. The mask pattern 475 may comprise an insulating material or a conductive material.

The etching process may cause top surfaces of the contact structure 470 and the first interlayer dielectric layer 450 on the contact region CR and the peripheral circuit region PR to reside at a level lower than that of the top surfaces of the contact structure 470 and the first interlayer dielectric layer 450 on the cell array region CAR. The first interlayer dielectric layer 450 on the contact and peripheral circuit regions CR and PR may have a reduced thickness, and the contact structure 470 on the contact region CR may have a reduced height. Accordingly, the contact structure 470 may have a first height H1 on the cell array region CAR and a second height H2 on the contact region CR, which first height H1 is greater than the second height H2 (H1>H2).

After the etch process, the mask patterns 475 may be removed.

Figure 22B:
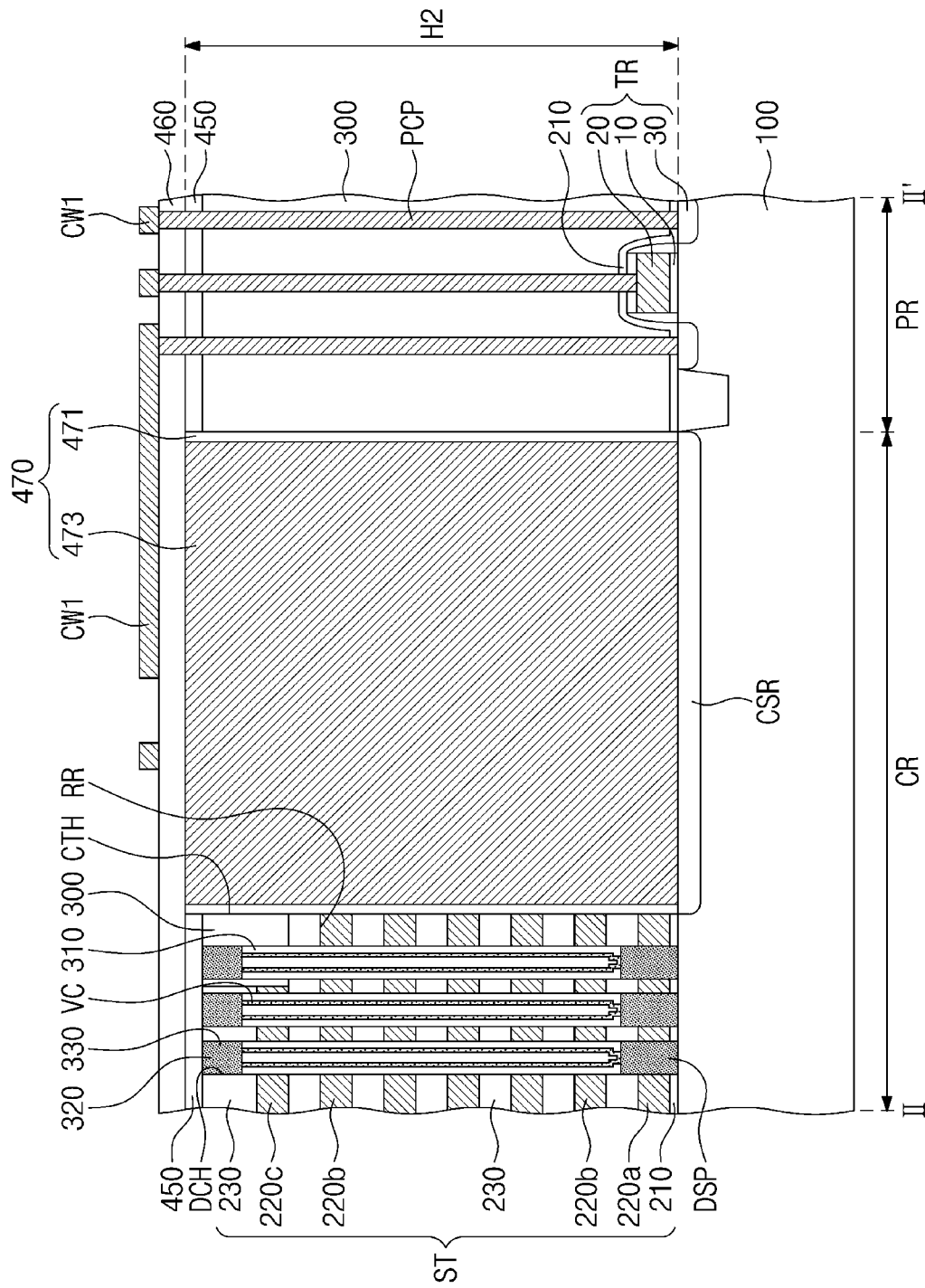

Referring to FIGS. 22A and 22B, a second interlayer dielectric layer 460 may be formed on the first interlayer dielectric layer 450. The second interlayer dielectric layer 460 may conformally cover the top surface of the first interlayer dielectric layer 450 and the top surface of the contact structure 470. The second interlayer dielectric layer 460 may be formed of a silicon oxide layer.

Cell contact plugs CCP may be formed on ends of the gate electrodes 220a, 220b, and 220c, which ends are disposed on the contact region CR. Peripheral contact plugs PCP may be formed on the source/drain regions 30 and the peripheral gate electrode 20 disposed on the peripheral circuit region PR of the substrate 100. The second interlayer dielectric layer 460 may expose top surfaces of the cell contact plugs CCP and top surfaces of the peripheral contact plugs PCP. The cell contact plugs CCP and the peripheral contact plugs PCP may include at least one of a metal (e.g., copper or tungsten) and a metal nitride (e.g., TiN, TaN, or WN).

First connection lines CW1 may be formed on the second interlayer dielectric layer 460. The first connection lines CW1 may be formed on some of the cell contact plugs CCP and of the peripheral contact plugs PCP. In an example, the some cell contact plugs CCP may be ones of the cell contact plugs CCP except for other cell contact plugs CCP formed on the string select gate electrode 220c and an uppermost one of the cell gate electrodes 220b. For example, the first connection lines CW1 may not be formed on the cell contact plugs CCP disposed on the string select gate electrode 220c and the uppermost cell gate electrode 220b.

The first connection lines CW1 may extend onto the peripheral circuit region PR and may be electrically connected to the peripheral contact plugs PCP. The first connection lines CW1 may include metal, such as copper or tungsten.

Figure 23A:
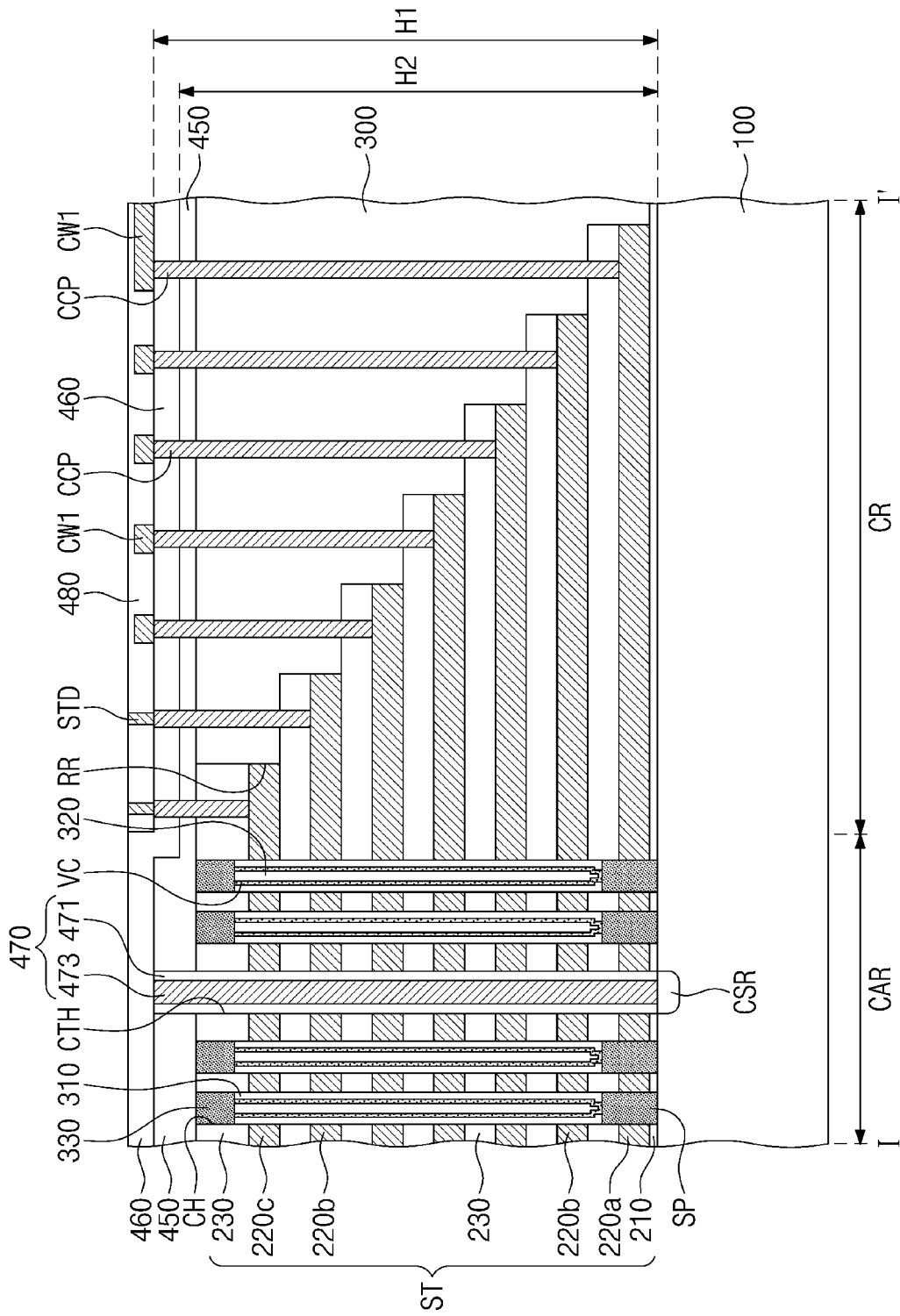
Figure 23B:
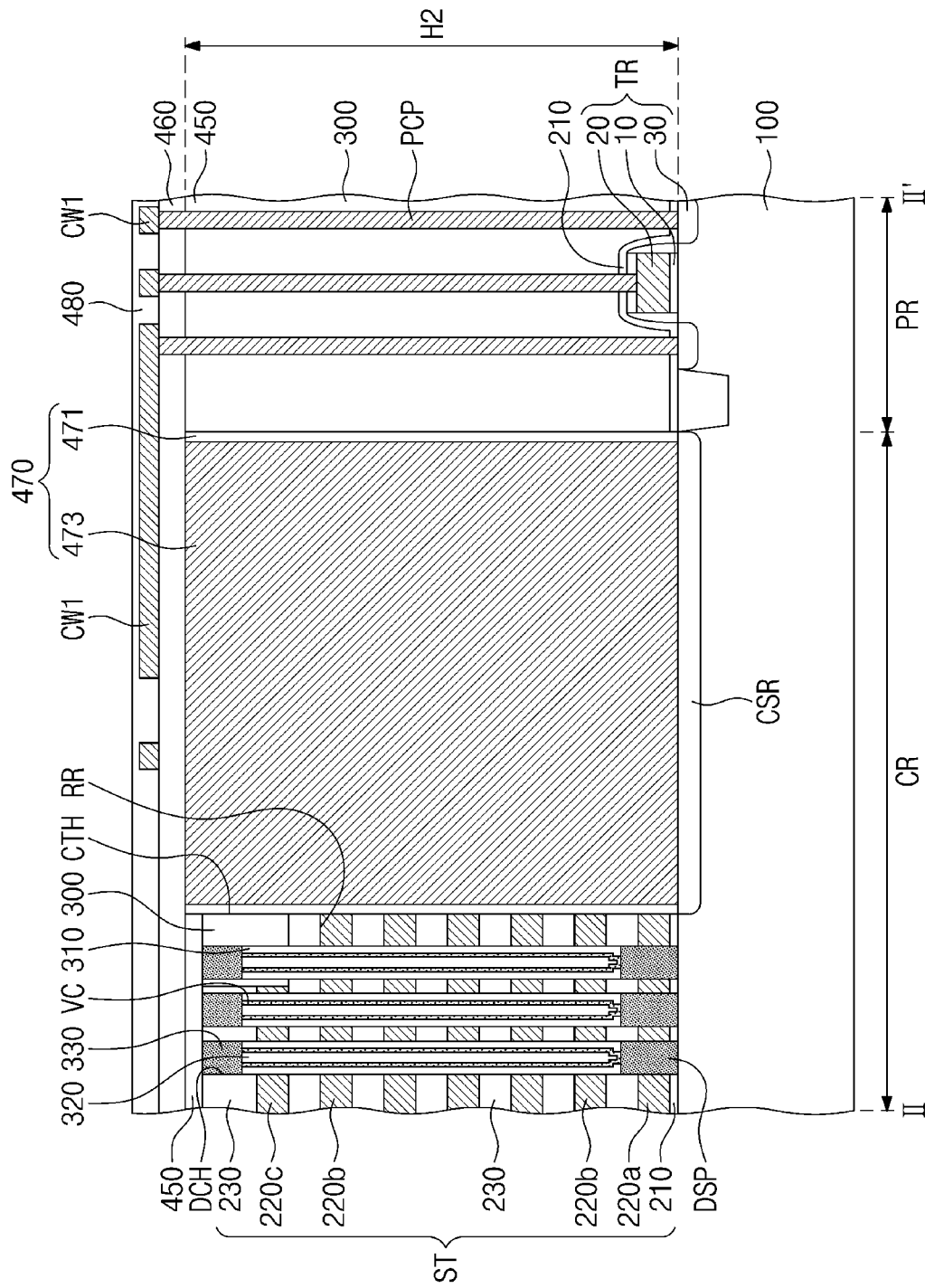

Referring to FIGS. 23A and 23B, a third interlayer dielectric layer 480 may be formed on the second interlayer dielectric layer 460. The forming of the third interlayer dielectric layer 480 may include forming an insulating layer (not shown) on the second interlayer dielectric layer 460 and performing a planarization process on the insulating layer. The third interlayer dielectric layer 480 may be formed locally on the contact and peripheral circuit regions CR and PR. The third interlayer dielectric layer 480 may have a top surface at the same level as that of a top surface of the second interlayer dielectric layer 460 formed on the cell array region CAR. The third interlayer dielectric layer 480 may comprise a silicon oxide layer.

Studs STD may be formed in the third interlayer dielectric layer 480. The studs STD may be formed on those cell contact plugs CCP which are not to receive the first connection lines CW1. In an example, the studs STD may be formed on the cell contact plugs CCP disposed on the string select gate electrode 220c and the uppermost cell gate electrode 220b. The studs STD may comprise at least one of a conductive metal nitride and a doped semiconductor.

Referring back to FIGS. 3 and 4, second connection lines CW2 may be formed on the studs STD. The second connection lines CW2 may be formed of a metal such as copper or tungsten. A fourth interlayer dielectric layer 490 may be formed on the second and third interlayer dielectric layers 460 and 480. The fourth interlayer dielectric layer 490 may cover the second connection lines CW2. The fourth interlayer dielectric layer 490 may comprise a silicon oxide layer.

Channel contact plugs HCP may be formed on the cell vertical channel structures VS. The channel contact plugs HCP may extend through the fourth interlayer dielectric layer 490, the second interlayer dielectric layer 460, and the first interlayer dielectric layer 450, and may contact the pads 330. The channel contact plugs HCP may include at least one of a metal (e.g., copper or tungsten) and a metal nitride (e.g., TiN, TaN, or WN).

Bit lines BL may be formed on the fourth interlayer dielectric layer 490. The bit lines BL may be electrically connected to the cell vertical channel structures VS arranged in the second direction (the Y direction in FIG. 2).

According to one aspect of the inventive concepts, a contact structure on a contact region may have a height less than that of the contact structure on a cell array region, and thus it may be possible to provide lowermost connection lines connected to cell contact plugs at a relatively low level in the device. Accordingly, channel contact plugs between bit lines and cell vertical channel structures may have minimal heights, which may decrease capacitances of the bit lines.

Finally, although the present invention has been described in connection with the examples of inventive concepts illustrated in the accompanying drawings, it will be understood to those skilled in the art that various changes and modifications may be made to such examples without departing from the technical spirit and essential feature of inventive concepts as defined by the appended claims.

What is claimed is:

1. A semiconductor memory device, comprising:
    a substrate having a cell array region and a contact region;
    a stack structure on the cell array region and the contact region of the substrate and comprising a plurality of gate electrodes, the gate electrodes being disposed one over another in the stack structure;
    a plurality of cell vertical channel structures on the cell array region of the substrate and extending through the stack structure; and
    a contact structure disposed beside the stack structure on a top surface of the substrate and disposed on both the cell array region and the contact region of the substrate along a line extending from the cell array region onto the contact region,
    wherein the contact structure is connected to a common source region disposed in the substrate, has a first height on the cell array region and a second height on the contact region, and the first height is different than the second height.

2. The semiconductor memory device of claim 1, wherein the first height is greater than the second height.

3. The semiconductor memory device of claim 2, further comprising a plurality of cell contact plugs on ends of the gate electrodes that are disposed on the contact region of the substrate,
    wherein top surfaces of the cell contact plugs are situated at a level lower than that of a top surface of the contact structure on the cell array region.

4. The semiconductor memory device of claim 2, further comprising a plurality of cell contact plugs on ends of the gate electrodes that are disposed on the contact region of the substrate,
    wherein top surfaces of the cell contact plugs are situated at a level higher than that of a top surface of the contact structure on the contact region.

5. The semiconductor memory device of claim 1, further comprising an interlayer dielectric layer on the stack structure,
    wherein the contact structure extends through the interlayer dielectric layer, and
    a top surface of the interlayer dielectric layer on the cell array region is located at a different level from that of a top surface of the interlayer dielectric layer on the contact region.

6. The semiconductor memory device of claim 5, wherein the top surface of the interlayer dielectric layer on the contact region is situated at a level lower than that of the top surface of the interlayer dielectric layer on the cell array region.

7. The semiconductor memory device of claim 1, wherein a top surface of the contact structure on the contact region is situated at a level higher than that of top surfaces of the cell vertical channel structures.

8. The semiconductor memory device of claim 1, wherein a top surface of the contact structure on the contact region is situated at a level lower than that of top surfaces of the cell vertical channel structures.

9. The semiconductor memory device of claim 1, wherein the gate electrodes comprise a first gate electrode and a second gate electrode, and
the semiconductor memory device further comprises:
a first cell contact plug on an end of the first gate electrode that is disposed on the contact region of the substrate; and
a second cell contact plug on an end of the second gate electrode that is disposed on the contact region of the substrate,
a top surface of the first cell contact plug and a top surface of the second cell contact plug being located at a same level.

10. The semiconductor memory device of claim 9, further comprising:
a first connection line connected to the first cell contact plug; and
a second connection line connected to the second cell contact plug,
wherein the first connection line and the second connection line are located at different levels.

11. The semiconductor memory device of claim 1, wherein the gate electrodes comprise a first gate electrode and a second gate electrode, and
the semiconductor memory device further comprises:
a first cell contact plug on an end of the first gate electrode that is disposed on the contact region of the substrate; and
a second cell contact plug on an end of the second gate electrode that is disposed on the contact region of the substrate,
a top surface of the first cell contact plug and a top surface of the second cell contact plug being located at different levels.

12. A semiconductor memory device, comprising:
a substrate having a cell array region and a contact region;
a stack structure on the cell array region and the contact region of the substrate and comprising a plurality of gate electrodes, the gate electrodes being disposed one over another in the stack structure;
a plurality of cell vertical channel structures extending through the stack structure on the cell array region of the substrate;
a contact structure disposed beside the stack structure on a top surface of the substrate and disposed on both the cell array region and the contact region of the substrate along a line extending from the cell array region onto the contact region; and
an interlayer dielectric structure covering a top surface of the contact structure,
wherein the interlayer dielectric structure has a first thickness on the cell array region and a second thickness on the contact region, and
the first thickness of the interlayer dielectric structure is different from the second thickness of the interlayer dielectric structure.

13. The semiconductor memory device of claim 12, wherein the first thickness is less than the second thickness.

14. A semiconductor memory device, comprising:
a substrate having a cell array region, a contact region and a peripheral region;
a peripheral transistor located at an upper portion of the peripheral region of the substrate;
a stack structure on the cell array region and the contact region of the substrate and comprising a plurality of gate electrodes, the gate electrodes being disposed one over another in the stack structure, and the plurality of gate electrodes having a staircase-shaped portion on the contact region;
a plurality of cell vertical channel structures extending through the stack structure on the cell array region of the substrate;
a contact structure disposed beside the stack structure on a top surface of the substrate and disposed on the cell array region and the contact region of the substrate along a line extending from the cell array region onto the contact region, the contact structure having a top surface including a first portion on the contact region of the substrate and a second portion on the cell array region, the first portion of the top surface of the contact structure being situated at a level lower than that of the second portion of the top surface of the contact structure;
an interlayer dielectric layer extending over the contact structure, over the stack structure on the cell array region and the contact region of the substrate, and over the peripheral transistor on the peripheral region of the substrate, the interlayer dielectric layer having a step such that a first portion of a top surface of the interlayer dielectric layer on the peripheral region of the substrate is situated at a level lower than that of a second portion of the top surface of the interlayer dielectric layer on the cell array region of the substrate;
a first cell contact plug on an end of a first one of the gate electrodes that is disposed on the contact region of the substrate, the first cell contact plug having a top surface at a same level as the first portion of the top surface of the interlayer dielectric layer;
a second cell contact plug on an end of a second one of the gate electrodes that is disposed on the contact region of the substrate, the second cell contact plug being disposed closer to the cell array region than the first cell contact plug;
a first connection line extending along the first portion of the top surface of the interlayer dielectric layer from the top surface of the first cell contact plug and over the peripheral region of the substrate, the first connection line being electrically connected to the peripheral transistor; and
a second connection line situated at a level above that of the first connection line,
wherein the second connection line is electrically connected to the second cell contact plug at a location situated at a same level as or at a level above the second portion of the top surface of the interlayer dielectric layer.

15. The semiconductor memory device of claim 14, wherein a top surface of the second cell contact plug is located at a same level as the top surface of the first cell contact plug, further comprising:
a stud extending vertically between and electrically connecting the second cell contact plug and the second connection line.

16. The semiconductor memory device of claim 14, wherein a top surface of the second cell contact plug is located at the same level as the second portion of the top surface of the interlayer dielectric layer, and the second connection line extends from the top surface of the second cell contact plug along the second portion of the top surface of the interlayer dielectric layer.

17. The semiconductor memory device of claim 14, further comprising a common source region at an upper portion of the cell array region of the substrate, the common source region having a conductivity of a type different than that of the substrate, wherein the contact structure comprises a contact extending horizontally on the common source region.

18. The semiconductor memory device of claim 17, wherein the contact structure extends contiguously along the cell array region and onto the contact region, and an upper portion of the contact structure is stepped.

19. The semiconductor memory device of claim 18, wherein a step in the upper portion of the contact structure is located over a boundary between the cell array region and the contact region of the substrate.

20. The semiconductor memory device of claim 18, wherein a step in the upper portion of the contact structure is located over part of the contact region of the substrate in between the cell array region and the peripheral region.

* * * * *